United States Patent
Park et al.

(10) Patent No.: US 12,492,334 B2
(45) Date of Patent: Dec. 9, 2025

(54) QUANTUM DOT, COMPOSITION FOR PREPARING QUANTUM DOT COMPOSITE, QUANTUM DOT COMPOSITE, AND DISPLAY PANEL

(71) Applicant: SAMSUNG ELECTRONICS CO., LTD., Suwon-si (KR)

(72) Inventors: Shang Hyeun Park, Yongin-si (KR); Shin Ae Jun, Seongnam-si (KR); Tae Gon Kim, Hwaseong-si (KR); Min Jong Bae, Yongin-si (KR); Deukseok Chung, Yongin-si (KR); A Ra Jo, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 801 days.

(21) Appl. No.: 17/858,417

(22) Filed: Jul. 6, 2022

(65) Prior Publication Data

US 2023/0022260 A1  Jan. 26, 2023

(30) Foreign Application Priority Data

Jul. 7, 2021  (KR) .................. 10-2021-0089076

(51) Int. Cl.
*C09K 11/02* (2006.01)
*B82Y 20/00* (2011.01)
(Continued)

(52) U.S. Cl.
CPC ............ *C09K 11/02* (2013.01); *C09K 11/025* (2013.01); *C09K 11/0883* (2013.01);
(Continued)

(58) Field of Classification Search
CPC . G02F 1/133617; C09K 11/02; C09K 11/025; C09K 11/703; C09K 11/0883; C09K 11/883
See application file for complete search history.

(56) References Cited

U.S. PATENT DOCUMENTS 9,517,936 B2  12/2016 Jeong et al.
10,961,446 B2  3/2021 Kim et al.
(Continued)

FOREIGN PATENT DOCUMENTS

CN    111183193 A    5/2020
CN    111518437 A    8/2020
(Continued)

OTHER PUBLICATIONS

Zhiping Hu, et al., Inkjet printed uniform quantum dots as color conversion layers for full-color OLED displays, Nanoscale, 2020, 12, pp. 2103-2110.
(Continued)

*Primary Examiner* — C Melissa Koslow
(74) *Attorney, Agent, or Firm* — CANTOR COLBURN LLP

(57) ABSTRACT

A quantum dot, a quantum dot composite including the quantum dot, a composition for preparing the quantum dot composite, a display panel including the quantum dot composite, and an electronic apparatus including the display panel. The quantum dot includes a semiconductor nanocrystal core including indium and phosphorus, the semiconductor nanocrystal core having an emission peak wavelength from about 600 nm to about 650 nm, or an emission peak wavelength from about 500 nm to about 550 nm, and an area of a peak from about 400° C. to about 500° C. is 0.17 times to 0.5 times relative to an area of a peak from about 200° C. to about 300° C. in a thermogravimetric analysis (TGA)

(Continued)

graph as determined with a differential scanning calorimeter (DSC).

16 Claims, 18 Drawing Sheets

(51) Int. Cl.
  *B82Y 40/00* (2011.01)
  *C09K 11/08* (2006.01)
  *C09K 11/70* (2006.01)
  *C09K 11/88* (2006.01)
  *G02F 1/13357* (2006.01)
  *H10K 59/12* (2023.01)
(52) U.S. Cl.
  CPC .......... *C09K 11/703* (2013.01); *C09K 11/883* (2013.01); *G02F 1/133617* (2013.01); *B82Y 20/00* (2013.01); *B82Y 40/00* (2013.01); *H10K 59/12* (2023.02)

(56) References Cited

U.S. PATENT DOCUMENTS

| | | | |
|---|---|---|---|
| 10,961,448 B2 | 3/2021 | Smith et al. | |
| 11,186,767 B2 | 11/2021 | Ahn et al. | |
| 11,762,289 B2 | 9/2023 | Youn et al. | |
| 11,866,624 B2 | 1/2024 | Choi et al. | |
| 2019/0129302 A1 | 5/2019 | Youn et al. | |
| 2020/0332181 A1 | 10/2020 | Zhang | |
| 2021/0102084 A1 | 4/2021 | Yang et al. | |

FOREIGN PATENT DOCUMENTS

| | | |
|---|---|---|
| JP | 2020522591 A | 7/2020 |
| JP | 2020526596 A | 8/2020 |
| KR | 1480475 B1 | 1/2015 |
| KR | 20170077944 A | 7/2017 |
| KR | 20180059724 A | 6/2018 |
| KR | 1977282 B1 | 5/2019 |
| KR | 20190047573 A | 5/2019 |
| KR | 20190106819 A | 9/2019 |
| KR | 2047460 B1 | 11/2019 |
| KR | 20200114869 A | 10/2020 |
| KR | 2207329 B1 | 1/2021 |

OTHER PUBLICATIONS

English Translation of Office Action dated Mar. 12, 2024, of the corresponding Chinese Patent Application No. 202210797332.1, 14 pp.
Office Action dated Mar. 12, 2024, of the corresponding Chinese Patent Application No. 202210797332.1, 8 pp.
Extended European Search Report dated Oct. 21, 2022, of the corresponding European Patent Application No. 22183231.4.

Pattern Preparation by using a photoresist

Repeating the Patterning Process three times

QUANTUM DOT, COMPOSITION FOR PREPARING QUANTUM DOT COMPOSITE, QUANTUM DOT COMPOSITE, AND DISPLAY PANEL

CROSS-REFERENCE TO RELATED APPLICATION

This application claims priority to Korean Patent Application No. 10-2021-0089076 filed in the Korean Intellectual Property Office on Jul. 7, 2021, and all the benefits accruing therefrom under 35 U.S.C. § 119, the content of which in its entirety is herein incorporated by reference.

BACKGROUND

1. Field

A quantum dot, a composition for preparing a quantum dot composite, a quantum dot composite, and a display panel are disclosed.

2. Description of the Related Art

Quantum dots are nano-sized semiconductor nanocrystal materials, and it is possible to control their optical properties, for example, luminous properties, by changing their size and/or composition. The luminous properties of quantum dots may be utilized in an electronic apparatus, for example, a display device. When utilized in a device, e.g., a display device, a plurality of quantum dots may be utilized in a form of a composite. There are needs for the development of quantum dots and quantum dot composites that are environmentally friendly and capable of exhibiting improved physical and/or optical properties, e.g., optical stability or luminescent properties, when utilized in an electronic apparatus, e.g., a display device.

SUMMARY

An embodiment provides quantum dots that may exhibit device stability over an extended period of operational time, i.e., ensuring high reliability, with relatively little, if any, decrease (or reduction) of luminance over time even if the quantum dots are exposed to a high-luminance light source.

Another embodiment provides a quantum dot composite including the quantum dots.

Another embodiment provides a composition for preparing the quantum dot composite, and a display panel including the quantum dot composite.

A quantum dot according to an embodiment includes a semiconductor nanocrystal core including indium and phosphorus, and the quantum dot has an emission peak wavelength between about 600 nm and about 650 nm, or an emission peak wavelength between about 500 nm and about 550 nm, wherein the quantum dot exhibits an area of a peak between about 400° C. to about 500° C. that is about 0.17 times to about 0.5 times relative to an area of a peak between about 200° C. to about 300° C. in a thermogravimetric analysis (TGA) graph as determined with a differential scanning calorimeter (DSC).

In the thermogravimetric analysis graph of the quantum dots, an area of a peak between about 200° C. to about 400° C. may be about 40% or more based on a total area of peaks, i.e., an area of a peak from about 200° C. to about 400° C. may be greater than or equal to about 40% of a total peak area of the thermogravimetric analysis graph.

The quantum dot may further include a semiconductor nanocrystal shell disposed on the semiconductor nanocrystal core, the semiconductor nanocrystal shell including zinc and selenium.

The semiconductor nanocrystal shell may further include sulfur.

The semiconductor nanocrystal shell may further include a first semiconductor nanocrystal shell disposed on the semiconductor nanocrystal core, the first semiconductor nanocrystal shell including zinc and selenium, and a second semiconductor nanocrystal shell disposed on the first semiconductor nanocrystal shell, the second semiconductor nanocrystal shell including zinc and sulfur.

The quantum dot may further include an organic compound disposed on a surface of the quantum dot, the organic compound may include a carboxyl group and/or a thiol group bound to the surface of the quantum dot.

The organic compound in which the portion of the organic compound bound to the surface of the quantum dot is a carboxyl group, and the organic compound may be represented by RCOOH, RCOOR', or a combination thereof, wherein R and R' are each independently a substituted or unsubstituted C1 to C30 saturated or unsaturated aliphatic hydrocarbon group, a substituted or unsubstituted C3 to C30 saturated or unsaturated alicyclic hydrocarbon group, a substituted or unsubstituted C6 to C30 aromatic hydrocarbon group, or a combination thereof.

The organic compound in which the portion of the organic compound bound to the surface of the quantum dot is a thiol group, and the organic compound may include an organic group of a C1 to C30 substituted or unsubstituted saturated or unsaturated aliphatic hydrocarbon group, a C3 to C30 substituted or unsubstituted saturated or unsaturated alicyclic hydrocarbon group, a C6 to a C30 substituted or unsubstituted aromatic hydrocarbon group, or a combination thereof, at a terminal end; and —{($C_nH_{2n}$)$_a$—O}—, wherein n and a are each independently an integer of greater than or equal to 1; and optionally —(C=O)O—, a substituted or unsubstituted C1 to C30 alkylene group, or a combination thereof, disposed between the thiol group and the organic group.

The organic compound in which the portion of the organic compound bound to the surface of the quantum dot is a thiol group, and the organic compound may be represented by Chemical Formula 1:

$$R—O—\{(C_nH_{2n})_aO\}_b—(C_nH_{2n})_c—(O)_d—(C=O)_e—(O)_f—(C_nH_{2n})_g—(CHSH)_h—(C_nH_{2n})_i—[(C=O)O\{(C_nH_{2n})_jO\}_kR]_l—(SH)_m$$

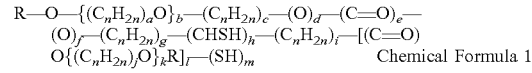

In Chemical Formula 1,

R is a substituted or unsubstituted C1 to C30 saturated or unsaturated aliphatic hydrocarbon group, a substituted or unsubstituted C3 to C30 saturated or unsaturated alicyclic hydrocarbon group, a substituted or unsubstituted C6 to C30 aromatic hydrocarbon group, or a combination thereof, n is an integer of greater than or equal to 1, a, b, c, g, i, j, and k are each independently an integer greater than or equal to 0, d, e, f, h, l, and m are all 0 or 1, provided that h and m are not both 0, when h and m are both 1, l is 0, and when h and l are both 1, m is 0.

The organic compound in which a portion is bound to a surface of the quantum dot is the thiol group may be represented by one or more of Chemical Formula 1-1 to Chemical Formula 1-6:

Chemical Formula 1-1
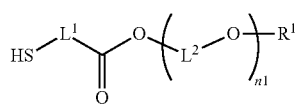

Chemical Formula 1-2
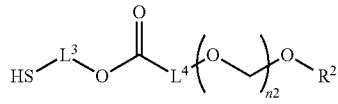

Chemical Formula 1-3
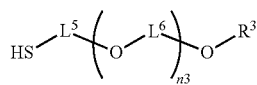

Chemical Formula 1-4
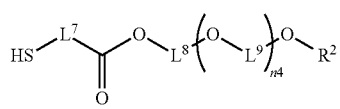

Chemical Formula 1-5
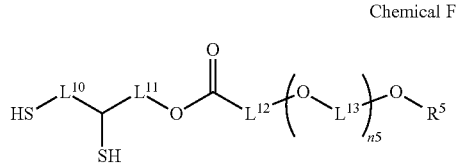

Chemical Formula 1-6
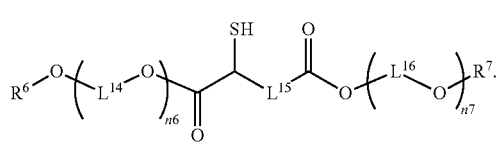

In Chemical Formula 1-1 to Chemical Formula 1-6,
$R^1$ to $R^7$ are each independently a substituted or unsubstituted C1 to C10 alkyl group or a substituted or unsubstituted C6 to C20 aryl group,
$L^1$ to $L^{16}$ are each independently a substituted or unsubstituted C1 to C10 alkylene group, and
n1 to n7 are each independently an integer of 0 to 10.

In the quantum dot, a weight ratio of a weight of zinc to a weight of indium may be about 10:1 to about 30:1, and a weight ratio of a weight of selenium to a weight of indium may be about 2.9:1 to about 20:1.

A composition for preparing a quantum dot composite according to another embodiment includes the quantum dots, and at least one of a polymerizable monomer including a carbon-carbon unsaturated bond and a dispersant.

The composition may further include a thiol compound having at least one thiol group at a terminal end, metal oxide particulates, or a combination thereof.

The dispersant may be an organic compound including a carboxyl group, and may include a combination of monomers including a first monomer having a carboxyl group and a carbon-carbon double bond, a second monomer having a carbon-carbon double bond and a hydrophobic moiety and not having a carboxyl group, and optionally a third monomer having a carbon-carbon double bond and a hydrophilic moiety and not having a carboxyl group, or a copolymer thereof; a multi-aromatic ring-containing polymer having a backbone in which two aromatic rings in a main chain are bound to quaternary carbon atoms that are constituent atoms of other cyclic moieties, and having a carboxyl group; or a combination thereof.

The metal oxide particulates may include $TiO_2$, $SiO_2$, $BaTiO_3$, $Ba_2TiO_4$, ZnO, or a combination thereof.

The thiol compound may include a compound represented by Chemical Formula 2:

Chemical Formula 2
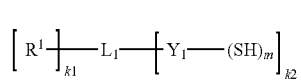

In Chemical Formula 2,
$R^1$ is hydrogen; a substituted or unsubstituted C1 to C30 linear or branched alkyl group; a substituted or unsubstituted C6 to C30 aryl group; a substituted or unsubstituted C3 to C30 heteroaryl group; a substituted or unsubstituted C3 to C30 cycloalkyl group; a substituted or unsubstituted C3 to C30 heterocycloalkyl group; a C1 to C10 alkoxy group; a hydroxy group; —$NH_2$; a substituted or unsubstituted C1 to C30 amine group (—NRR', wherein R and R' are each independently hydrogen or a C1 to C30 linear or branched alkyl group and not hydrogen at the same time); an isocyanate group; a halogen; —ROR' wherein R is a substituted or unsubstituted C1 to C20 alkylene group and R' is hydrogen or a C1 to C20 linear or branched alkyl group; an acyl halide group (—RC(=O)X, wherein R is a substituted or unsubstituted C1 to C20 alkylene group and X is a halogen); —C(=O)OR' (wherein R' is hydrogen or a C1 to C20 linear or branched alkyl group); —CN; or —C(=O)ORR' or —C(=O)ONRR' (wherein R and R' are each independently hydrogen or a C1 to C20 linear or branched alkyl group),
$L_1$ is a carbon atom, a substituted or unsubstituted C1 to C30 alkylene group, a substituted or unsubstituted C1 to C30 alkylene group in which at least one methylene (—$CH_2$—) is replaced by sulfonyl (—$SO_2$—), carbonyl (CO), ether bond (—O—), sulfide group (—S—), sulfoxide group (—SO—), ester group (—C(=O)O—), amide group (—C(=O)NR—, wherein R is hydrogen or a C1 to C10 linear or branched alkyl group), or a combination thereof, a substituted or unsubstituted C3 to C30 cycloalkylene group, a substituted or unsubstituted C6 to C30 arylene group, a substituted or unsubstituted C3 to C30 heteroarylene group, or a substituted or unsubstituted C3 to C30 heterocycloalkylene group,
$Y_1$ is a single bond; a substituted or unsubstituted C1 to C30 alkylene group; a substituted or unsubstituted C2 to C30 alkenylene group; or a C1 to C30 alkylene group or a C2 to C30 alkenylene group in which at least one methylene (—$CH_2$—) is replaced by sulfonyl (—S(=O)$_2$—), carbonyl (—C(=O)—), ether bond (—O—), sulfide group (—S—), sulfoxide group (—S(=O)—), ester group (—C(=O)O—), amide group (—C(=O)NR—, wherein R is hydrogen or a C1 to C10 linear or branched alkyl group), imine group (—NR—, wherein R is hydrogen or a C1 to C10 linear or branched alkyl group), or a combination thereof,
m is an integer of greater than or equal to 1,
k1 is 0 or an integer of greater than or equal to 1, and k2 is an integer of greater than or equal to 1,
a sum of m and k2 is an integer of greater than or equal to 3,
m does not exceed the valence of $Y_1$, and
a sum of k1 and k2 does not exceed the valence of $L_1$.

A quantum dot composite according to another embodiment includes a polymer matrix, and a plurality of quantum dots dispersed in the polymer matrix. The quantum dot composite is configured to emit green light or red light, wherein the plurality of quantum dots includes a semiconductor nanocrystal core including indium and phosphorus, and wherein an intensity of a peak from about 350° C. to about 450° C. may be about 8 times to about 13 times relative to an intensity of a peak from about 200° C. and about 300° C. in a thermogravimetric analysis graph of the quantum dot composite as determined with a differential scanning calorimeter (DSC).

The plurality of quantum dots further includes a semiconductor nanocrystal shell disposed on a semiconductor nanocrystal core, the semiconductor nanocrystal shell including zinc, selenium, and sulfur, and may include about 0.5 weight percent (wt %) to about 2.5 wt % of indium, about 10 wt % to about 25 wt % of zinc, about 4.5 wt % to about 15 wt % of selenium, and about 5 wt % to about 15 wt % of selenium based on a total weight of the quantum dot composite.

The plurality of quantum dots may further include a semiconductor nanocrystal shell disposed on the semiconductor nanocrystal core, the semiconductor nanocrystal shell including zinc, selenium, and sulfur, and if the plurality of quantum dots are green light-emitting quantum dots, a mole ratio of the moles of zinc to the sum total of moles of sulfur and selenium in the quantum dot composite as determined by ICP (Inductively Coupled Plasma) emission spectroscopy may be greater than or equal to about 1.12:1, and if the plurality of quantum dots are red light-emitting quantum dots, a mole ratio of moles of zinc to a sum total of moles of sulfur and selenium in the quantum dot composite as determined by ICP emission spectroscopy may be greater than or equal to about 1.0:1.

A display panel according to another embodiment includes a quantum dot composite produced from the composition for preparing a quantum dot composite, or the aforementioned quantum dot composite.

The display panel may include a color conversion layer including a plurality of regions including a color conversion region, and the quantum dot composite may be disposed in the color conversion region of the color conversion layer.

The display panel may further include a light emitting panel including a light emitting source, and the color conversion layer may convert a spectrum of light emitted from the light emitting panel.

The quantum dot composite including the quantum dots according to an embodiment together with the polymer matrix may exhibit stable luminescence characteristics with little, if any, decrease (or reduction) in luminance even when the quantum dot composite is driven under a high-luminance light source for an extended period of time. Therefore, the quantum dot composite according to an embodiment may be advantageously applied to achieve high luminance, high color purity, and high reliability in various display devices, in particular, devices that implement images such as virtual reality (VR) and augmented reality (AR: Augmented Reality) that require high brightness, e.g., display devices such as watches and televisions.

DETAILED DESCRIPTION

Figure 1A:
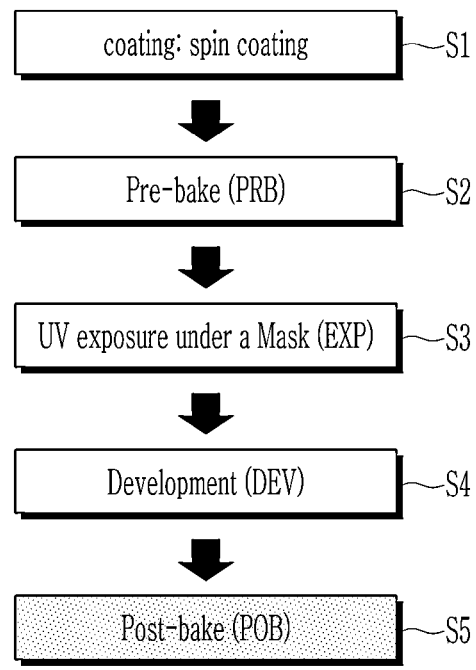
FIG. 1A schematically shows a pattern forming process using a composition for producing a quantum dot composite according to an embodiment.
Figure 1A:
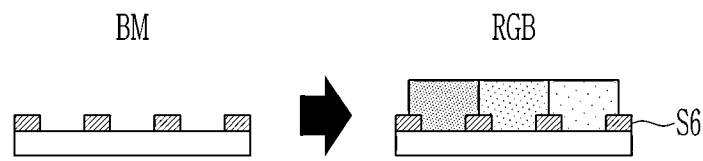

Advantages and characteristics of this disclosure, and a method for achieving the same, will become evident referring to the following embodiments together with the drawings attached hereto. However, the embodiments should not be construed as being limited to the embodiments set forth herein. If not defined otherwise, all terms (including technical and scientific terms) in the specification may be defined as commonly understood by one skilled in the art.

The terms defined in a generally-used dictionary may not be interpreted ideally or exaggeratedly unless clearly defined.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. In addition, unless explicitly described to the contrary, the word "comprise" and variations such as "comprises" or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

In the drawings, the thickness of layers, films, panels, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third," etc. may be used herein to describe various elements, components, regions, layers and/or sections, these elements, components, regions, layers, and/or sections should not be limited by these terms. These terms are only used to distinguish one element, component, region, layer, or section from another element, component, region, layer, or section. Thus, "a first element," "component," "region," "layer," or "section" discussed below could be termed a second element, component, region, layer, or section without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±20%, 10% or 5% of the stated value.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, as used herein, when a definition is not otherwise provided, "substituted" refers to replacement of hydrogen of a compound by a substituent that may be a C1 to C30 alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxy group (—OH), a nitro group (—NO$_2$), a cyano group (—CN), an amino group (—NRR' wherein R and R' are each independently hydrogen or a C1 to C6 alkyl group), an azido group (—N$_3$), an amidino group (—C(=NH)NH$_2$), a hydrazino group (—NHNH$_2$), a hydrazono group (=N(NH$_2$)), an aldehyde group (—C(=O)H), a carbamoyl group (—C(O)NH$_2$), a thiol group (—SH), an ester group (—C(=O)OR, wherein R is a C1 to C6 alkyl group or a C6 to C12 aryl group), a carboxyl group (—COOH) or a salt thereof (—C(=O)OM, wherein M is an organic or inorganic cation, a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), or a combination thereof.

As used herein, "monovalent organic a functional group" refers to a C1 to C30 alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, or a C2 to C30 heterocycloalkyl group.

In addition, when a definition is not otherwise provided below, "hetero" means one including 1 to 3 heteroatoms that may be N, O, S, Si, or P.

As used herein, "alkylene group" is a linear or branched saturated aliphatic hydrocarbon group that optionally includes at least one substituent and has two or more valences. As used herein, "arylene group" may be a functional group that optionally includes at least one substituent, and having two or more valences formed by removal of at least two hydrogens in at least one aromatic ring.

In addition, "aliphatic group" refers to a saturated or unsaturated linear or branched C1 to C30 group consisting of carbon and hydrogen, and "aromatic organic group" includes a C6 to C30 aryl group or a C2 to C30 heteroaryl group, and "alicyclic group" refers to a saturated or unsaturated C3 to C30 cyclic group consisting of carbon and hydrogen.

As used herein, the term "(meth)acrylate" refers to acrylate and/or methacrylate.

As used herein, "light conversion rate" is a ratio of the emission amount green or red (G or R) (which is denoted as A) of the quantum dot composite to the amount of light (B-B') absorbed from the excitation light (e.g., blue light) (B) of the quantum dot composite. In addition, the "light conversion efficiency" is a ratio of the emission amount (G or R) of the quantum dot composite to the emission amount (B) of the excitation light. The total light amount (B) of excitation light is obtained by integrating a PL spectrum, the PL spectrum of the quantum dot composite film is measured, a light amount (G or R) in a green or red wavelength emitted from the quantum dot composite film and a light amount (B') of excitation light are obtained, and light conversion rate, light conversion efficiency, and blue light absorption rate are obtained by the following equations:

$$A/(B-B') \times 100 = \text{light conversion rate (\%)}$$

$$A/B \times 100 = \text{light conversion efficiency (\%)}$$

$$(B-B')/B \times 100 = \text{blue light absorption rate (\%) of single film.}$$

As used herein, "dispersion" refers to dispersion wherein a dispersed phase is a solid and a continuous phase includes a liquid. The "dispersion" may include a colloidal dispersion wherein the dispersed phase has a dimension of greater than or equal to about 1 nanometer (nm), for example, greater than or equal to about 2 nm, greater than or equal to about 3 nm, or greater than or equal to about 4 nm and several micrometers (μm) or less, (e.g., about 2 μm or less or about 1 μm or less).

Herein, the term "quantum dots" refer to a nanostructure that exhibits quantum confinement or exciton confinement, such as semiconductor-based nanocrystals (particles), for example, luminescent nanostructure (e.g., capable of emitting light by energy excitation). As used herein, the term "quantum dots" are not limited in shapes thereof, unless otherwise defined.

Here, "a dimension (e.g., size, diameter, thickness, etc.)" may be an average dimension (e.g., size, diameter, thickness, etc.). Here, the "average" may be mean or median. The dimension may be a value obtained by electron microscopic analysis. The dimension may be a value calculated in consideration of the composition and optical properties (e.g., UV absorption wavelength) of the quantum dots.

Herein, "quantum efficiency (or quantum yield)" may be measured in a solution state or in a solid state (in a composite). In an embodiment, quantum efficiency (or quantum yield) is the ratio of photons emitted to photons absorbed by the nanostructure or population thereof. In an embodiment, quantum efficiency may be measured by any method. For example, for fluorescence quantum yield or efficiency, there may be two methods: an absolute method and a relative method. In the absolute method, quantum efficiency is obtained by detecting the fluorescence of all samples through an integrating sphere. In the relative method, the quantum efficiency of the unknown sample is calculated by comparing the fluorescence intensity of a standard dye (standard sample) with the fluorescence intensity of the unknown sample. Coumarin 153, Coumarin 545, Rhodamine 101 inner salt, Anthracene and Rhodamine 6G may be used as standard dyes according to their PL wavelengths, but the present disclosure is not limited thereto.

The quantum efficiency (or quantum yield) may be easily and reproducibly determined using commercially available equipment from Hitachi or Hamamatsu, etc. and referring to manuals provided by, for example, respective equipment manufacturers.

The full width at half maximum (FWHM) and maximum emission (PL: photoluminescence) peak wavelength may be measured, for example, by an emission spectrum obtained by a spectrophotometer such as a fluorescence spectrophotometer or the like Herein, the description that does not include cadmium (or other toxic heavy metals or given elements) means that a concentration of cadmium (or the corresponding heavy metals or given elements) is less than or equal to about 100 ppm, less than or equal to about 50 ppm, less than or equal to about 10 ppm, or near zero. In an embodiment, substantially no cadmium (or its heavy metal) is present, or, if present, in an amount below the detection limit of a given detection means or at an impurity level.

The semiconductor nanocrystals, also called "quantum dots," are crystalline semiconductor materials with nanoscale particle sizes. The quantum dots have a large surface area per unit volume, exhibits a quantum confinement effect, and may exhibit properties different from those of bulk materials having the same composition. The quantum dots absorb light from an excitation source and emit energy corresponding to their energy bandgap.

The quantum dots may be applied as light emitting materials in display devices. For example, the quantum dot composite including a plurality of quantum dots dispersed in a polymer matrix or the like may be used as a light conversion layer (e.g., a color conversion layer) that converts a light (e.g., blue light) from a light source (e.g., a backlight unit (BLU)) to a light of a desired wavelength, for example, green light or red light in a display device. That is, unlike the conventional absorption type color filter, a patterned film including the quantum dot composite may be used as an emission type color filter. Since the emission type color filter is disposed in front of the display device, when excitation light that has linearity by passing through, for example, a liquid crystal layer, reaches the emission type color filter, it is scattered in all directions to realize a wider viewing angle, and light loss due to the absorption type color filter may be avoided.

In order to form a color conversion layer with quantum dots, it is necessary to prepare, for example, a photoresist (PR) composition or ink composition including quantum dots, and to apply the composition to a patterning process or a printing process to form a pixel having a desired pattern. In order to prepare such a PR composition or ink composition, quantum dots should be well mixed with a monomer or a binder included in the PR composition or ink composition, and for this purpose, the following two methods may be used.

The first method is to use an amphoteric solvent that can be mixed well with both the quantum dots and the binder. A composition, for example, a PR composition, can be prepared by uniformly dispersing the quantum dots and the binder using an amphoteric solvent.

Another method is to substitute a ligand on a surface of the quantum dots with another ligand. In the case of preparing quantum dots by using a commonly used wet preparing method, an organic solvent, which was used in the preparation of quantum dots, or an organic compound, which was added in order to control sizes of the quantum dots or passivate the surface defects of the quantum dots during the quantum dot preparing process, may be present and bound to the surface of the quantum dots. In this way, by substituting the organic solvent and/or organic compound bound to the surface of the quantum dots, that is, the so-called ligand material with a hydrophilic material, the hydrophilic material substituted quantum dots may be well dispersed in the PR composition or ink composition.

However, the first method has a problem that the dispersion degree of quantum dots may vary depending on the type or characteristics of the solvent, and there are not many types of amphoteric solvents applicable for industrial purposes. In addition, when the above solvent is used, dispersibility is not sufficient and a dispersant should be added to the composition, and in that case, there is a problem in that a viscosity range of the composition should be limited. In addition, the method of using an amphoteric solvent is mainly applicable to the PR composition. Although the method may be applied to an ink composition, it is not suitable to apply such a composition as a color conversion layer.

In the second method, the properties of the quantum dots may vary a lot depending on how the ligand substitution (ligand exchange) is conducted, and the second method may be applied to a solvent-free ink composition that does not include a solvent and also to a photoresist composition. However, such a ligand substitution method may be approached as one of the methods for dispersing quantum dots in a photoresist or ink composition, and the inventors are not aware of research on the ability of a composite including ligand-substituted quantum dots through this method to confirm whether stable luminescence characteristics can be obtained with little or no decrease (reduction) in initial luminance over time when driven for an extended time under a high-luminance light source.

A color conversion layer using quantum dots may be applied to various display devices. Examples of such a display device include various devices such as a watch, a mobile phone, a TV, AR, and VR. Among these devices, a device including a liquid crystal display (LCD) or an organic light emitting diode (OLED) as a light source may have sufficient white luminance from a blue luminance of about 1,000 nits to about 3,000 nits and a sufficient life-span of greater than or equal to about 10,000 hours (hr). However, in the case of a mini LED, micro LED (µLED), etc., a blue light source of hundreds of thousands of nits is required, and therefore, in such an application a color conversion layer for such a high-luminance light source, the stability of quantum dots over time is very important. Among the quantum dots developed to date, we know of no reports of quantum dots that can operate at hundreds of thousands of nits for 500 hours or more without significant decreases or reduction in luminance over that time. For example, in the case of previously developed green quantum dots, application of a light source with an initial luminance of about 100,000 nits, luminance may significantly decrease over time, and thus, the luminance decreases from an initial luminance value by about 30% or more at or before 100 hours, or by about 50% or more after 200 hours.

The present inventors set out to solve the above issue of luminance instability with an objective to prepare a color conversion layer including a quantum dot composite that can be stably driven for an extended period with a relatively small decrease or reduction in luminance even when a high-luminance light source is applied. In their work, the inventors have observed that when the ligands present on the surface of the quantum dots have a specific composition, a quantum dot composite including such quantum dots may be used to address the above problem.

Specifically, the quantum dot according to an embodiment includes a semiconductor nanocrystal core including indium and phosphorus, and the quantum dot has an emission peak wavelength from about 600 nm to about 650 nm, or an emission peak wavelength from about 500 nm to about 550 nm, wherein the quantum dot exhibits an area of a peak from about 400° C. to about 500° C. that is about 0.17 times or more relative to an area of a peak from about 200° C. to about 300° C. in a thermogravimetric analysis (TGA) graph as determined with a differential scanning calorimeter (DSC). Moreover, the quantum dot exhibits an area of a peak from about 400° C. to about 500° C. that is about 0.5 times or less relative to an area of a peak from about 200° C. to about 300° C. in a thermogravimetric analysis (TGA) graph as determined with a differential scanning calorimeter (DSC).

"Thermogravimetric analysis (TGA)" is a method to track weight changes of a material with temperature to analyze properties (e.g., a composition and the like) of the material. In general, a material is pyrolyzed by heating and exhibits a weight reduction at a certain temperature or temperature range. Accordingly, the observed weight changes of a sample material resulting from such heating may provide information on the material components of a composition, properties of the composition components, and the like. For example, when a peak appears in a specific temperature range in a thermogravimetric analysis (TGA) graph of a sample material, the material may include a component compound that decomposes within the temperature range with a consequent weight reduction of the sample material. In addition, when the above peak appears in various temperature ranges in the TGA graph, the sample material may be interpreted to include several different component compounds or types of materials that may form a mixture or a complex. Furthermore, an area of the peak may be used to analyze a relative content of a component compound that decomposes within a temperature range. In other words, if a peak has a relatively larger area, the amount (i.e., weight) of the component compound that decomposes within the temperature range may be larger than other components with smaller peak areas in the material sample.

In other words, the quantum dots according to an embodiment include at least one type of component compound that decomposes from about 400° C. to about 500° C. and at least another type of component compound that decomposes from about 200° C. and about 300° C. as observed in a TGA graph analyzed with differential scanning calorimeter (DSC). Accordingly, there may be at least two different types of component compounds that make up the sample material, wherein a content (weight) of at least one component compound decomposes from about 400° C. to about 500° C. is greater than or equal to about 0.17 times of the content (weight) of at least another type of component compound of the sample material that decomposes from about 200° C. and about 300° C. The reason is that the quantum dots include a first compound that thermally decomposes from about 400° C. to about 500° C. and a second compound that thermally decomposes from about 200° C. and about 300° C. We have identified these two compounds as two different compounds on the surface, e.g., bound to a surface, that is, being present as ligands bound to a surface of a quantum dot, wherein, without being bound by theory, it may be interpreted that the first compound is present in a weight ratio of about 0.17 times or more relative to the weight of the second compound. Accordingly, the quantum dots according to an embodiment include at least two different types of compounds on the surface, wherein at least one type of compound is a compound that decomposes from about 400° C. to about 500° C., and the other, at least another type of compound that decomposes from about 200° C. and about 300° C., wherein a content (weight) of the at least one type of compound decomposes from about 400° C. to about 500° C. is about 0.17 times or more relative to the content (weight) of the at least another type of compound that decomposes from about 200° C. and about 300° C. In an embodiment, on the surface of the quantum dots, the ratio of the content (weight) of the at least one type of compound that decomposes from about 400° C. to about 500° C. relative to the content (weight) of the at least another type of compound that decomposes from about 200° C. and about 300° C. may be, for example, about 0.175 times or more, about 0.18 times or more, about 0.19 times or more, about 0.2 times or more, about 0.3 times or more, about 0.4 times or more, or about 0.45 times or more, and within these ranges, is not limited to the above content ratios. Moreover, the ratio of the content (weight) of the at least one type of compound that decomposes from about 400° C. to about 500° C. relative to the content (weight) of the at least another type of compound that decomposes from about 200° C. and about 300° C. may be, for example, about 0.5 times or less, for example, about 0.45 times or less, for example, about 0.4 times or less, for example, about 0.3 times or less, for example, about 0.2 times or less and within these ranges, is not limited to the above content ratios.

In this way, the quantum dots according to an embodiment include at least two types of compounds that decompose in each respective temperature range to satisfy a specific area ratio in the TGA graph. When a quantum dot composite including the quantum dots according to an embodiment is applied to a color conversion layer, and an extended irradiation of the quantum dot composite by excitation light with high luminance, for example, a light source of about 100,000 nits is applied, the luminance maintains at least greater than or equal to 80%, or at least greater than or equal to 90%, of the initial luminance after 500 hours. In other words, the quantum dots according to an embodiment may be advantageously applied to various display devices that require application of a light source with a high luminance in the tens of thousands of nits or more.

In addition, in an embodiment, an area of a peak from about 200° C. and about 400° C. in the TGA graph of the quantum dot may be about 40% or more based on the total peak area. That is, the quantum dots may be quantum dots containing 40% or more of a surface ligand that is observed to decompose at a temperature from about 200° C. to about 400° C. based on the content of all ligand components present on the surface of the quantum dots.

Methods of substituting out a ligand on the surface of quantum dots for the purpose of simply improving dispersibility of the quantum dots, or for stability of a composition including the quantum dots, is generally known, for example, a method of substituting out a ligand originally present on the surface of the quantum dot with another ligand in an exchange process, or partially substituting with other ligands is generally known. However, as the inventors demonstrate from examples and comparative examples to be described later, in the case of the latter, a quantum dot composite produced with quantum dots including only one type of compound ligand by substituting out all, or nearly all, of the existing ligands with another ligand, the luminance is shown to rapidly decrease within a predetermined time when excitation light is irradiated using a light source of 100,000 nits. In addition, even if the quantum dots include two or more different ligand compounds, if the ligand does not exhibit a peak in a specific temperature range on the aforementioned TGA graph, or the area ratio of the corresponding peak does not meet the area ratio on the TGA graph of the quantum dots according to an embodiment, the quantum dot composite including the quantum dots may not maintain a long-term high luminance and/or high color purity when a light source with a high luminance in the tens of thousands of nits or more is applied, as in the quantum dot composite including the quantum dots according to the embodiment. Therefore, the quantum dots according to an embodiment is not simply quantum dots including two or more different ligands or two or more different ligands in a specific ratio, but instead, may be quantum dots in which two types of peaks are shown in a specific temperature range on the TGA graph and the area ratio between these two types of peaks satisfies the specific ratio or ratios described above.

When the emission peak of the quantum dots according to an embodiment is from about 500 nm and about 550 nm, that is, when the quantum dots emit green light, an emission peak of the quantum dots may be greater than or equal to about 510 nm, greater than or equal to about 520 nm, greater than or equal to about 530 nm, or greater than or equal to about 535 nm, and less than or equal to about 545 nm, less than or equal to about 540 nm, or less than or equal to about 535 nm.

When the emission peak of the quantum dots according to an embodiment is from about 600 nm to about 650 nm, that is, when the quantum dots emit red light, an emission peak of the quantum dots may be greater than or equal to about 605 nm, greater than or equal to about 610 nm, greater than or equal to about 615 nm, greater than or equal to about 620 nm, or greater than or equal to about and 650 nm, and less than or equal to about 645 nm, less than or equal to about 640 nm, or less than or equal to about 630 nm.

As described above, the quantum dots according to an embodiment may include a semiconductor nanocrystal core including indium and phosphorus and may further include a semiconductor nanocrystal shell disposed on the semiconductor nanocrystal core, the semiconductor nanocrystal shell including zinc and selenium. In addition, the semiconductor nanocrystal shell may further include sulfur.

When the semiconductor nanocrystal shell further includes sulfur, the semiconductor nanocrystal shell may further include a first semiconductor nanocrystal shell disposed on the semiconductor nanocrystal core, the first semiconductor nanocrystal shell including zinc and selenium, and a second semiconductor nanocrystal shell disposed on the first semiconductor nanocrystal shell, the second semiconductor nanocrystal shell including zinc and sulfur. The first semiconductor nanocrystal shell may not include ZnSeS. The first semiconductor nanocrystal shell may be disposed directly on the semiconductor nanocrystal core.

The second semiconductor nanocrystal shell may include ZnS. The second semiconductor nanocrystal shell may not include selenium. The second semiconductor nanocrystal shell may be disposed directly on the first semiconductor nanocrystal shell. The second semiconductor nanocrystal shell may be an outermost layer of the quantum dots.

In an embodiment, the semiconductor nanocrystal core may or may not further include zinc.

In an embodiment, the semiconductor nanocrystal core may be InP or InZnP. An (average) size of the core may be greater than or equal to about 1 nm, greater than or equal to about 1.5 nm, greater than or equal to about 2 nm, greater than or equal to about 3 nm, or greater than or equal to about 3.3 nm. For example, a size of the core may be less than or equal to about 5 nm, less than or equal to about 4 nm, or less than or equal to about 3.8 nm.

In an embodiment, a shell thickness of the quantum dots may be greater than or equal to about 1.5 nm, greater than or equal to about 1.6 nm, greater than or equal to about 1.7 nm, greater than or equal to about 1.8 nm, greater than or equal to about 1.9 nm, or greater than or equal to about 2 nm. For example, the thickness of the semiconductor nanocrystal shell may be less than or equal to about 2.5 nm, less than or equal to about 2.4 nm, less than or equal to about 2.3 nm, less than or equal to about 2.2 nm, or less than or equal to about 2.1 nm.

In an embodiment, the thickness of the first semiconductor nanocrystal shell may be about 3 monolayers (ML) or more, for example, about 3.5 ML or more, about 3.6 ML or more, about 3.7 ML or more, about 3.8 ML or more, about 3.9 ML or more, about 4 ML or more, about 4.1 ML or more, about 4.2 ML or more, about 4.3 ML or more, or about 4.4 ML or more. The thickness of the first semiconductor nanocrystal shell may be about 7 ML or less, for example, about 6 ML or less, or about 5 ML or less.

In an embodiment, the thickness of the first semiconductor nanocrystal shell may be greater than or equal to about 0.9 nm, greater than or equal to about 1 nm, greater than or equal to about 1.1 nm, greater than or equal to about 1.2 nm, greater than or equal to about 1.3 nm, greater than or equal to about 1.4 nm, greater than or equal to about 1.43 nm, or greater than or equal to about 1.45 nm. In an embodiment, the thickness of the first semiconductor nanocrystal shell may be less than or equal to about 1.8 nm, less than or equal to about 1.75 nm, less than or equal to about 1.7 nm, less than or equal to about 1.6 nm, less than or equal to about 1.55 nm, or less than or equal to about 1.51 nm.

A (average) thickness of the second semiconductor nanocrystal shell may be less than or equal to about 0.65 nm, less than or equal to about 0.64 nm, less than or equal to about 0.63 nm, less than or equal to about 0.62 nm, less than or equal to about 0.61 nm, less than or equal to about 0.6 nm, or less than or equal to about 0.59 nm. The thickness of the second semiconductor nanocrystal shell may be greater than or equal to about 0.4 nm, greater than or equal to about 0.45 nm, greater than or equal to about 0.5 nm, greater than or equal to about 0.51 nm, greater than or equal to about 0.52 nm, greater than or equal to about 0.53 nm, or greater than or equal to about 0.54 nm.

The quantum dots may refer to one particle (single entity) or a plurality of particles, and may not contain harmful heavy metals (e.g., cadmium, lead, mercury, or a combination thereof).

In the quantum dots of an embodiment, a weight ratio (Zn:In) of a weight of zinc to a weight of indium may be in a range from 10:1 to about 30:1, for example, from about 11:1 to about 29:1, from about 11.5:1 to about 27:1, from about 11.7:1 to about 26:1, but is not limited thereto. For example, the weight ratio (Zn:In) of a weight of zinc to a weight of indium may be in a range from about 11.3:1, from about 11.5:1, from about 11.7:1, from about 11.75:1, from about 12:1, from about 13:1, from about 13.5:1, from about 14:1, from about 15:1, from about 16:1, from about 17:1, from about 18:1, from about 19:1, from about 20:1, from about 21:1, from about 22:1, from about 23:1, from about 24:1, from about 25:1, and to about 30:1, and to about 29:1, to about 28:1, to about 27.5:1, to about 27:1, to about 26.5:1, to about 26:1, to about 25.8:1, to about 25.7:1, to about 25.5:1, to about 25:1, to about 24:1, to about 23:1, to about 22:1, to about 21:1, to about 20:1, to about 19:1, to about 18:1, to about 17:1, to about 16:1, to about 15.5:1, to about 15:1, to about 14:1, to about 13.5:1, to about 13:1, to about 12.5:1, to about 12:1, to about 11.75:1, to about 11.5:1, to about 11:1, or to about 10.5:1, but is not limited thereto.

In the quantum dots according to an embodiment, a weight ratio (Se:In) of a weight of selenium to a weight of indium may be in a range from about 2.9:1 to about 20:1. For example, a weight ratio (Se:In) of a weight of selenium to a weight of indium may be in a range from about 3:1, from about 4:1, from about 5:1, from about 6:1, from about 7:1, from about 8:1, from about 9:1, from about 10:1, from about 11:1, from about 12:1, from about 13:1, from about 14:1, from about 15:1, from about 16:1, from about 17:1, from about 18:1, or from about 19:1, and to about 20:1, to about 19:1, to about 18:1, to about 17:1, to about 16:1, to about 15:1, to about 14:1, to about 13:1, to about 12:1, to about 11:1, to about 10.5:1, to about 10:1, to about 9:1, to about 8:1, to about 7:1, to about 6:1, to about 5:1, to about 4:1, or to about 3:1, but is not limited thereto.

In the quantum dots according to an embodiment, a weight ratio (S:In) of a weight of sulfur to a weight of indium may be in a range greater than or equal to about 1:1 and less than or equal to about 10:1, for example, greater than or equal to about 1.2:1 and less than or equal to about 9:1, less than or equal to about 1.25:1 and less than or equal to about 8.7:1, but is not limited thereto. For example, the ratio may be greater than or equal to about 1.2:1, greater than or equal to about 1.28:1, greater than or equal to about 1.3:1, greater than or equal to about 1.5:1, greater than or equal to about 2:1, greater than or equal to about 3:1, greater than or equal to about 4:1, greater than or equal to about 5:1, greater than or equal to about 6:1, greater than or equal to about 7:1, greater than or equal to about 8:1, or greater than or equal to about 9:1, and less than or equal to about 10:1, less than or equal to about 9.5:1, less than or equal to about 9:1, less than or equal to about 8.7:1, less than or equal to about 8.5:1, less than or equal to about 8:1, less than or equal to about 7:1, or less than or equal to about 6:1, but is not limited thereto. In considering the weight ratio of the weight of sulfur to the weight of indium in the quantum dots, a content of sulfur derived from a ligand capable of binding to the surface of the quantum dots as described below is not considered in the weight ratio. Rather, the weight of sulfur is determined solely by the presence of sulfur in the shell precursors.

In the quantum dots, a mole ratio of moles of indium to a sum moles of sulfur and selenium (In:(S+Se)) may be greater than or equal to about 0.09:1, greater than or equal to about 0.095:1, greater than or equal to about 0.097:1, or greater than or equal to about 0.0975:1. In the quantum dots, a mole ratio of moles of indium to the sum moles of sulfur and selenium (In:(S+Se)) may be less than or equal to about 0.12:1, less than or equal to about 0.115:1, less than or equal to about 0.113:1, less than or equal to about 0.111:1, less than or equal to about 0.11:1, or less than or equal to about 0.109:1. Again, the moles of sulfur is determined solely by the presence of sulfur in the shell precursors.

In the quantum dots, a mole ratio ((S+Se):In) of the sum moles of sulfur and selenium to indium may be greater than or equal to about 8.96:1, greater than or equal to about 9.1:1, greater than or equal to about 9.2:1, greater than or equal to about 9.3:1, greater than or equal to about 9.4:1, greater than or equal to about 9.5:1, greater than or equal to about 9.6:1, greater than or equal to about 9.65:1, greater than or equal to about 9.7:1, greater than or equal to about 9.8:1, greater than or equal to about 9.9:1, greater than or equal to about 10:1, greater than or equal to about 10.1:1, or greater than or equal to about 10.2:1. In the quantum dots, the mole ratio of the sum moles of sulfur and selenium to indium ((S+Se):In) may be less than or equal to about 10.5:1, less than or equal to about 10.3:1, or less than or equal to about 10.25:1. The moles of sulfur is determined solely by the presence of sulfur in the shell precursors.

A size of the quantum dots according to an embodiment may be greater than or equal to about 7.5 nm, greater than or equal to about 7.6 nm, or greater than or equal to about 7.7 nm. The size of the quantum dots may be less than or equal to about 8 nm, less than or equal to about 7.9 nm, or less than or equal to about 7.8 nm.

The size or average size of the quantum dots may be calculated from an electron microscope analysis image. In an embodiment, the size (or average size) may be a diameter or equivalent diameter (or an average value thereof) determined from electron microscopy image analysis.

The shape of the quantum dots is not particularly limited, and may include, for example, spherical, polyhedral, pyramidal, multi-pod, or cubic, nanotubes, nanowires, nanofibers, nanosheets, or a combination thereof, but is not limited thereto.

As described above, the quantum dot according to an embodiment may include two or more different ligands on its surface, that is, two or more different compounds, for example, two or more organic compounds, and these two or more organic compounds may be bound to the surface of the quantum dots.

The organic compound may include RCOOH, RNH$_2$, R$_2$NH, R$_3$N, RSH, RH$_2$PO, R$_2$HPO, R$_3$PO, RH$_2$P, R$_2$HP, R$_3$P, ROH, RCOOR', RPO(OH)$_2$, R$_2$POOH, {wherein R and R' are each independently a (e.g., C1 to C40 or C3 to C35 or C8 to C24) substituted or unsubstituted aliphatic hydrocarbon group (e.g., an alkyl group, an alkenyl group, or an alkynyl group), a substituted or unsubstituted (e.g., C3 to C30) alicyclic hydrocarbon group (e.g., a cyclopropyl group, a cyclobutyl group, a cyclopentyl group, a cyclohexyl group, a cycloheptyl group, a cyclooctyl group, a cyclononyl group, etc.), a substituted or unsubstituted (e.g., C6 to C40 or C6 to C30) aromatic hydrocarbon group (e.g., an aryl group, etc.), or a combination thereof}, or a combination thereof.

Specific examples of the organic compound may include a thiol compound such as methane thiol, ethane thiol, propane thiol, butane thiol, pentane thiol, hexane thiol, octane thiol, dodecane thiol, hexadecane thiol, octadecane thiol, or benzyl thiol; an amine compound such as methane amine, ethane amine, propane amine, butyl amine, pentyl amine, hexyl amine, octyl amine, dodecyl amine, hexadecyl amine, octadecyl amine, dimethyl amine, diethyl amine, or dipropyl amine; an carboxyl group-containing compound such as methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, palmitic acid, or benzoic acid; an aliphatic phosphine compound such as substituted or unsubstituted methyl phosphine (e.g., trimethyl phosphine, methyldiphenyl phosphine, etc.), substituted or unsubstituted ethyl phosphine (e.g., triethyl phosphine, ethyldiphenyl phosphine, etc.), substituted or unsubstituted propyl phosphine, substituted or unsubstituted butyl phosphine, substituted or unsubstituted pentyl phosphine, or substituted or unsubstituted octylphosphine (e.g., trioctylphosphine (TOP)); a phosphine oxide compound such as a substituted or unsubstituted methyl phosphine oxide (e.g., trimethyl phosphine oxide, methyldiphenyl phosphine oxide, etc.), substituted or unsubstituted ethyl phosphine oxide (e.g., triethyl phosphine oxide, ethyldiphenyl phosphineoxide, etc.), substituted or unsubstituted propyl phosphine oxide, substituted or unsubstituted butyl phosphine oxide, or substituted or unsubstituted octylphosphine oxide (e.g., trioctylphosphine oxide (TOPO), and the like; an aromatic phosphine compound such as diphenyl phosphine or triphenyl phosphine, or an oxide compound thereof; a phosphonic acid, and the like, but are not limited thereto. In particular, in addition to the compounds exemplified above, examples of the organic compound having a thiol group at one terminal end may include a compound represented by Chemical Formula 1 as described later.

The organic compound coordinates to the surface of the quantum dots according to an embodiment and may facilitate the dispersion of the quantum dots in materials that are used to form a matrix for preparing a quantum dot composite, for example, a polymerizable monomer, an organic solvent, or a binder resin. In addition, if two or more different types of these organic compounds are present on a surface of the quantum dots, the quantum dots according to an embodiment exhibits a peak in a specific temperature range in the aforementioned TGA graph, and the type and content thereof are selected such that the area between these peaks indicates a specific area ratio, and thus high luminance and high color purity may be maintained with little consequent reduction of luminance even when the quantum dot composite including such quantum dots is driven under a high-luminance light source for an extended period of time. Examples of such an organic compound are not limited to a specific compound, and as long as there are two or more organic compounds capable of exhibiting an area ratio of a specific peak in the aforementioned temperature range in the TGA graph as determined by DSC, and a content ratio between such two or more organic compounds is satisfied, any combination of at least two different organic compounds (or surface ligands) may be used to achieve the technical objectives of a quantum dot composite as described herein.

In an embodiment, the organic compound may include an organic compound in which a portion bound to the surface of the quantum dots is a carboxyl group, and/or an organic compound in which a portion bound to the surface of the quantum dots is a thiol group but is not limited thereto.

For example, the organic compound in which the portion bound to the surface of the quantum dot is the carboxyl group may be represented by RCOOH, RCOOR', or a combination thereof, where R and R' are each independently a substituted or unsubstituted C1 to C30 saturated or unsaturated aliphatic hydrocarbon group, a substituted or unsubstituted C3 to C30 saturated or unsaturated alicyclic hydrocarbon group, a substituted or unsubstituted C6 to C30 aromatic hydrocarbon group, or a combination thereof.

In an embodiment, the organic compound in which the portion bound to the surface of the quantum dots is the carboxyl group may be a compound including a carboxyl group as described above, for example, methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, palmitic acid, benzoic acid, and the like, but is not limited thereto.

Examples of the organic compound in which the portion bound to the surface of the quantum dot is the thiol group may include a thiol compound such as methane thiol, ethane thiol, propane thiol, butane thiol, pentane thiol, hexane thiol, octane thiol, dodecane thiol, hexadecane thiol, octadecane thiol, or benzyl thiol. For example, an organic compound including a thiol group bound to the quantum dots at one terminal end, an organic group of a substituted or unsubstituted C1 to C30 saturated or unsaturated aliphatic hydrocarbon group, a substituted or unsubstituted C3 to C30 saturated or unsaturated alicyclic hydrocarbon group, a substituted or unsubstituted C6 to C30 substituted or unsubstituted aromatic hydrocarbon group, or a combination thereof, at the other terminal end, and —{(C$_n$H$_{2n}$)$_a$—O}— (wherein n and a are each independently an integer of greater than or equal to 1), and optionally —(C=O)O—, a substituted or unsubstituted C1 to C30 alkylene group, or a combination thereof between the thiol group and the organic group.

In an embodiment, the organic compound in which the portion bound to the surface of the quantum dot is a thiol group may be represented by the following Chemical Formula 1:

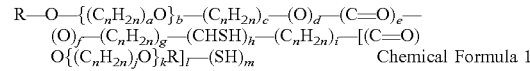

Chemical Formula 1

In Chemical Formula 1,

R is a substituted or unsubstituted C1 to C30 saturated or unsaturated aliphatic hydrocarbon group, a substituted or unsubstituted C3 to C30 saturated or unsaturated alicyclic hydrocarbon group, a substituted or unsubstituted C6 to C30 aromatic hydrocarbon group, or a combination thereof, n is an integer of greater than or equal to 1,
a, b, c, g, i, j, and k are each independently an integer of greater than or equal to 0,
d, e, f, h, l, and m are all 0 or 1, provided that h and m are not both 0,
when h and m are both 1, l is 0, and
when h and l are both 1, m is 0.

For example, the organic compound in which the portion bound to the surface of the quantum dots is a thiol group may be represented by one or more of Chemical Formula 1-1 to Chemical Formula 1-6:

Chemical Formula 1-1

Chemial Formula 1-2

Chemical Formula 1-3

Chemical Formula 1-4

Chemical Formula 1-5

Chemical Formula 1-6

In Chemical Formula 1-1 to Chemical Formula 1-6,
$R^1$ to $R^7$ are each independently a substituted or unsubstituted C1 to C10 alkyl group or a substituted or unsubstituted C6 to C20 aryl group,
$L^1$ to $L^{16}$ are each independently a substituted or unsubstituted C1 to C10 alkylene group, and
n1 to n7 are each independently an integer of 0 to 10.

Specific examples of the compounds represented by Chemical Formula 1-1 to Chemical Formula 1-6 may include compounds represented by Chemical Formula A to Chemical Formula H, but are not necessarily limited thereto:

Chemical Formula A

Chemical Formula B

Chemical Formula C

Chemical Formula D

In Chemical Formula D, m1 is an integer from 0 to 10.

Chemical Formula E

Chemical Formula F

Chemical Formula G

Chemical Formula H

In an embodiment, the organic compound in which the portion bound to the surface of the quantum dots is the thiol group may be included in an amount of greater than about 60 mole percent (mol %) based on the total number of moles of all organic compounds present on the surface of the quantum dots, that is, the organic compound in which the portion bound to the surface of the quantum dots is the carboxyl group and the organic compound in which the portion bound to the surface of the quantum dots is the thiol group. For example, the organic compound in which the portion bound to the surface of the quantum dots is the thiol group may be included in an amount of greater than or equal to about 65 mol %, for example, greater than or equal to about 70 mol %, or for example, greater than or equal to about 75 mol %, and for example, less than about 90 mol %, for example, less than or equal to about 85 mol %, for example, less than or equal to about 80 mol %, for example, about 65 mol % to about 85 mol %, for example, about 70 mol % to about 85 mol %, for example, about 70 mol % to about 80 mol %, based on the total number of moles of all organic compounds present on the surface of the quantum dots, but is not limited thereto.

By including the organic compound in which the portion bound to the surface of the quantum dots is the thiol group based on the total number of moles of the organic compound in which the portion binding to the surface of the quantum dots is the carboxyl group and the organic compound in which the portion binding to the surface of the quantum dots is the thiol group, within the above content ranges, the quantum dots including these organic compounds on the surface according to an embodiment may have the aforementioned two peaks in each temperature range on the TGA graph as determined by DSC, and the area ratio of these peaks satisfying the aforementioned ranges. The quantum dots according to an embodiment, as described later, may be applied to electronic apparatus including various light sources in the form of quantum dot composites, and may provide excellent luminescence characteristics with high color purity with little, if any, reduction in luminance even when driven under a high-luminance light source for an extended period of time.

In an embodiment, the quantum dots may have a quantum efficiency of greater than or equal to about 90%, greater than or equal to about 91%, greater than or equal to about 92%, greater than or equal to about 93%, greater than or equal to about 94%, or greater than or equal to about 95% in a solution state or a solid state. In addition, the quantum dots may have a full width at half maximum (FWHM) of less than or equal to about 40 nm, for example, less than or equal to about 39 nm, less than or equal to about 38 nm, less than or equal to about 36 nm, less than or equal to about 35 nm, in a solution state or a solid state.

The quantum dots according to an embodiment may be prepared by a method that includes preparing a core that includes semiconductor nanocrystals including indium and phosphorus, and introducing precursors for forming a semiconductor nanocrystal shell including zinc and selenium, and optionally sulfur, on the core in a suitable solvent, together with the prepared core. One may also include an additional semiconductor nanocrystal shell including zinc and sulfur, and optionally selenium, to the particles in which the semiconductor nanocrystal shell is formed on the semiconductor nanocrystal core. A method of further introducing second shell precursors for forming a second semiconductor nanocrystal shell, and thus, to prepare quantum dots according to an embodiment is described briefly below, and also in the Example section of the application.

In this case, the quantum dots may include a first semiconductor nanocrystal shell including zinc and selenium, and optionally sulfur, on the semiconductor nanocrystal core including indium and phosphorus, and a second semiconductor nanocrystal shell including zinc and sulfur, and optionally selenium on the first semiconductor nanocrystal shell. Herein, a sulfur precursor may not be included when the first semiconductor nanocrystal shell is formed, and/or a selenium precursor may not be included when the second semiconductor nanocrystal shell is formed. Accordingly, the quantum dots may include a semiconductor nanocrystal core including indium and phosphorus, a first semiconductor nanocrystal shell disposed on the semiconductor nanocrystal core and including zinc and selenium; and a second semiconductor nanocrystal shell disposed on the first semiconductor nanocrystal shell and including zinc and sulfur.

In addition, the quantum dots according to an embodiment may include two or more types of ligands, that is, two or more types of organic compounds, on the surface of the quantum dot prepared as described above, by including two or more types of organic compounds to be disposed on the surface of the quantum dot in a solvent used for preparing the quantum dot. Alternatively, one type of organic compound, for example, the first compound alone is added to the solvent used for preparing the quantum dots, the prepared quantum dots are separated, and the prepared quantum dots are added into a solvent including a second compound different from the first compound and a ligand exchange reaction occurs. As a result, the second compound exchanges with the first compound at the surface during preparation of the quantum dots. Alternatively, a portion of the first compound may be substituted with the second compound. As a result, quantum dots in which both the first compound and the second compound are present on the surface may be prepared. Although the aforementioned methods of ligand exchange are well known to those skilled in the art, and quantum dots according to an embodiment may be easily prepared by any of these methods, the inventors have identified that at least two or more compounds disposed on the surface of the quantum dot must necessarily include an area ratio of specific peaks in the aforementioned temperature ranges on the TGA graph as determined by DSC.

When preparing the quantum dots, if necessary, the reaction may be performed by further including a surfactant, etc. in addition to the aforementioned organic compound.

The semiconductor nanocrystal core including indium and phosphorus is commercially available or may be synthesized by a known method for producing an indium phosphide-based core. The core of an embodiment may be prepared by a hot injection method in which a solution including metal precursors such as an indium precursor and, optionally, a ligand are heated to a high temperature, for example, about 200° C. or higher, and a phosphorus precursor is injected.

In each reaction step for producing the quantum dots, the content between the zinc precursor, the selenium precursor, and the sulfur precursor relative to indium and the total moles of each precursor may be adjusted to satisfy the composition of the aforementioned quantum dots. In each step, the desired reaction time may be adjusted to obtain the desired composition and/or structure (e.g., core/multilayer shell structure) in the final quantum dot.

The zinc precursor is not particularly limited, and may be a Zn metal powder, an alkylated Zn compound, a Zn alkoxide, a C2 to C10 Zn carboxylate, a Zn nitrate, a Zn perchlorate, a Zn sulfate, a Zn acetylacetonate, a Zn halide, a Zn cyanide, a Zn hydroxide, a Zn oxide, a Zn peroxide, or a combination thereof. Examples of the first shell precursor may include dimethyl zinc, diethyl zinc, zinc acetate, zinc acetylacetonate, zinc iodide, zinc bromide, zinc chloride, zinc fluoride, zinc carbonate, zinc cyanide, zinc nitrate, zinc oxide, zinc peroxide, zinc perchlorate, zinc sulfate, etc.

The selenium-containing precursor is not particularly limited, and may be for example, selenium, selenium-trioctylphosphine (Se-TOP), selenium-tributylphosphine (Se-TBP), selenium-triphenylphosphine (Se-TPP), or a combination thereof, but is not limited thereto.

The sulfur-containing precursor is not particularly limited, and may be, for example, a sulfur powder, hexane thiol, octane thiol, decane thiol, dodecane thiol, hexadecane thiol, mercaptopropyl silane, sulfur-trioctylphosphine (S-TOP), sulfur-tributylphosphine (S-TBP), sulfur-triphenylphosphine (S-TPP), sulfur-trioctylamine (S-TOA), trimethylsilyl sulfur, ammonium sulfide, sodium sulfide, or a combination thereof.

The (organic) solvent may include C6 to C22 primary amines such as hexadecylamine; C6 to C22 secondary amines such as dioctylamine; C6 to C40 tertiary amines such as trioctylamine; nitrogen-containing heterocyclic compounds such as pyridine; C6 to C40 aliphatic hydrocarbons (e.g., alkanes, alkenes, alkynes, etc.) such as hexadecane, octadecane, octadecene, and squalane; C6 to C30 aromatic hydrocarbons such as phenyldodecane, phenyltetradecane, and phenyl hexadecane; phosphine substituted with a C6 to C22 alkyl group such as trioctylphosphine; phosphine oxide substituted with a C6 to C22 alkyl group such as trioctylphosphine oxide; C12 to C22 aromatic ethers such as phenyl ether, benzyl ether, and a combination thereof. Types and contents of the solvent may be appropriately selected in consideration of the types of the precursors and the organic ligand.

When the nonsolvent is added into the final reaction solution including the prepared quantum dots, the organic ligand-coordinated nanocrystal may be separated (e.g., precipitated). The nonsolvent may be a polar solvent that is miscible with the solvent used in the reaction and semiconductor nanocrystals are not dispersible therein. The nonsolvent may be selected depending on the solvent used in the reaction and may be for example, acetone, ethanol, butanol, isopropanol, ethanediol, water, tetrahydrofuran (THF), dimethylsulfoxide (DMSO), diethylether, formaldehyde, acetaldehyde, a solvent having a similar solubility parameter to the foregoing solvents, or a combination thereof.

The quantum dots precipitated by the addition of a nonsolvent may be separated through methods such as centrifugation, precipitation, chromatography, and distillation. The separated quantum dots can be cleaned using washing solvent as needed. The washing solvent is not particularly limited, and a solvent having a solubility parameter similar to that of the ligand coordinated to the surface of the quantum dots may be used. Examples thereof may include hexane, heptane, octane, chloroform, toluene, benzene, and the like, but are not limited thereto.

A composition for preparing a quantum dot composite according to another embodiment includes the aforementioned quantum dots, and at least one of a polymerizable monomer and a dispersant.

The polymerizable monomer may be a (photo) polymerizable monomer including a carbon-carbon double bond. The dispersant may disperse the quantum dots. The dispersant may include a carboxyl group (—COOH)— containing compound (monomer or polymer). The composition may optionally further include a (thermal or photo) initiator, and/or (organic) solvent (and/or liquid vehicle). The composition may be a photosensitive composition.

Since the details for the quantum dots in the composition are the same as those of the quantum dots according to the embodiment described above, detailed descriptions thereof will be omitted.

The content of the quantum dots in the composition may be appropriately adjusted in consideration of the end use (e.g., such as a color conversion layer of an emission type color filter or a color conversion panel). In the composition (or composite), the content of quantum dot(s) may be greater than or equal to about 1 wt %, for example, greater than or equal to about 2 wt %, greater than or equal to about 3 wt %, greater than or equal to about 4 wt %, greater than or equal to about 5 wt %, greater than or equal to about 6 wt %, greater than or equal to about 7 wt %, greater than or equal to about 8 wt %, greater than or equal to about 9 wt %, greater than or equal to about 10 wt %, greater than or equal to about 15 wt %, greater than or equal to about 20 wt %, greater than or equal to about 25 wt %, greater than or equal to about 30 wt %, greater than or equal to about 35 wt %, or greater than or equal to about 40 wt % based on the total weight or total solid content of the composition or composite. The content of the quantum dot may be less than or equal to about 70 wt %, less than or equal to about 65 wt %, less than or equal to about 60 wt %, less than or equal to about 55 wt %, less than or equal to about 50 wt %, less than or equal to about 45 wt %, less than or equal to about 40 wt %, or less than or equal to about 30 wt % based on the total weight or total solid content of the composition or composite. Herein, (e.g., when the composition includes an organic solvent), the content based on the total solids in the composition may correspond to the content of the corresponding component in the quantum dot composite. For example, when the quantum dot composition is a solvent-free system (not including an organic solvent), the content range in the composition may correspond to the content range in the composite.

The dispersant may contribute to providing greater dispersibility of quantum dots or metal oxide particulates to be described later. In an embodiment, the dispersant may be, for example, an organic compound having a carboxyl group, such as a monomer or a polymer, and may include, for example, a binder polymer. The dispersant or binder polymer may be an insulating polymer.

The organic compound having the carboxyl group may include a combination of monomers including a first monomer having a carboxyl group and a carbon-carbon double bond, a second monomer having a carbon-carbon double bond and a hydrophobic moiety and not having a carboxyl group, and optionally a third monomer having a carbon-carbon double bond and a hydrophilic moiety and not having a carboxyl group, or a copolymer thereof; a multi-aromatic ring-containing polymer (hereinafter, cardo binder) having a backbone in which two aromatic rings in a main chain are bonded to quaternary carbon atoms that are constituent atoms of other cyclic moieties, and having a carboxyl group; or a combination thereof.

The dispersant may include the first monomer, the second monomer, and optionally the third monomer.

The content of the dispersant (or binder polymer) in the composition may be greater than or equal to about 0.5 wt %, for example, greater than or equal to about 1 wt %, greater than or equal to about 5 wt %, greater than or equal to about 10 wt %, greater than or equal to about 15 wt %, greater than or equal to about 20 wt %, greater than or equal to about 30 wt %, greater than or equal to about 40 wt %, or greater than or equal to about 50 wt % based on the total weight or total solid content of the composition or composite, but is not limited thereto. The content of the dispersant (or binder polymer) may be less than or equal to about 60 wt %, less than or equal to about 50 wt %, less than or equal to about 40 wt %, less than or equal to about 35 wt %, less than or equal to about 33 wt %, less than or equal to about 30 wt %, less than or equal to about 20 wt %, or less than or equal to about 10 wt % based on the total weight or total solid content of the composition or composite. The content of the dispersant (or binder polymer) may be about 0.5 wt % to about 55 wt % based on the total weight or total solid content of the composition or composite.

The polymerizable (e.g., photopolymerizable) monomer including the carbon-carbon double bond may include a (e.g., photopolymerizable) (meth)acrylic monomer. The monomer may be a precursor for the insulating polymer.

The content of the monomer may be greater than or equal to about 0.5 wt %, for example, greater than or equal to about 1 wt %, greater than or equal to about 2 wt %, greater than or equal to about 5 wt %, greater than or equal to about 10 wt %, greater than or equal to about 15 wt %, greater than or equal to about 20 wt %, greater than or equal to about 25 wt %, or greater than or equal to about 30 wt % based on the total weight or total solid content of the composition or composite. The content of the (photo)polymerizable monomer may be less than or equal to about 60 wt %, less than or equal to about 50 wt %, less than or equal to about 40 wt %, less than or equal to about 30 wt %, less than or equal to about 28 wt %, less than or equal to about 25 wt %, less than or equal to about 23 wt %, less than or equal to about 20 wt %, less than or equal to about 18 wt %, less than or equal to about 17 wt %, less than or equal to about 16 wt %, or less than or equal to about 15 wt % based on the total weight or total solid content of the composition or composite.

The (photo)initiator included in the composition may be used for (photo)polymerization of the aforementioned monomer. The initiator is a compound accelerating a radical reaction (e.g., radical polymerization of monomer) by producing radical chemical species under a mild condition (e.g., by heat or light). The initiator may be a thermal initiator or a photoinitiator. The initiator is not particularly limited and may be appropriately selected.

In the composition, the content of the initiator may be appropriately adjusted considering types and contents of the polymerizable monomers. In an embodiment, the content of the initiator may be greater than or equal to about 0.01 wt %, for example, greater than or equal to about 1 wt %, greater than or equal to about 5 wt %, or greater than or equal to about and/or 10 wt %, and less than or equal to about for example, 9 wt %, less than or equal to about 8 wt %, less than or equal to about 7 wt %, less than or equal to about 6 wt %, or less than or equal to about 5 wt % based on the total weight of the composition (or the total weight of the solid content), but is not limited thereto.

The composition may further include a (multi- or monofunctional) thiol compound having at least one thiol group at the terminal end, metal oxide particulates, or a combination thereof.

The metal oxide particulates may include $TiO_2$, $SiO_2$, $BaTiO_3$, $Ba_2TiO_4$, ZnO, or a combination thereof. In an embodiment, the metal oxide particulates may be $TiO_2$.

The content of the metal oxide particulates in the composition may be greater than or equal to about 1 wt %, greater than or equal to about 5 wt %, greater than or equal to about 10 wt %, greater than or equal to about 15 wt %, greater than or equal to about 20 wt %, greater than or equal to about 25 wt %, greater than or equal to about 30 wt %, or greater than or equal to about 35 wt % and/or less than or equal to about 60 wt %, less than or equal to about 50 wt %, less than or equal to about 40 wt %, less than or equal to about 30 wt %, less than or equal to about 25 wt %, less than or equal to about 20 wt %, less than or equal to about 15 wt %, less than or equal to about 10 wt %, or less than or equal to about 5 wt % based on the total weight of the composition (or the solid weight thereof). The metal oxide particulates may be non-luminescent. Here, the term metal oxide may include oxides of a metal or a semi-metal.

The diameter of a metal oxide fine particulate is not particularly limited and may be appropriately selected. A diameter of the metal oxide particulates may be greater than or equal to about 100 nm, for example greater than or equal to about 150 nm, or greater than or equal to about 200 nm, and less than or equal to about 1,000 nm, less than or equal to about 800 nm, less than or equal to about 500 nm, less than or equal to about 400 nm, or less than or equal to about 300 nm.

The thiol compound included in the composition may be represented by Chemical Formula 2:

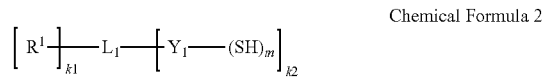

Chemical Formula 2

In Chemical Formula 2, $R^1$ is hydrogen; a substituted or unsubstituted C1 to C30 linear or branched alkyl group; a substituted or unsubstituted C6 to C30 aryl group; a substituted or unsubstituted C3 to C30 heteroaryl group; a substituted or unsubstituted C3 to C30 cycloalkyl group; a substituted or unsubstituted C3 to C30 heterocycloalkyl group; a C1 to C10 alkoxy group; a hydroxy group; —$NH_2$; a substituted or unsubstituted C1 to C30 amine group (—NRR', wherein R and R' are each independently hydrogen or a C1 to C30 linear or branched alkyl group and not hydrogen at the same time); an isocyanate group; a halogen; —ROR' wherein R is a substituted or unsubstituted C1 to C20 alkylene group and R' is hydrogen or a C1 to C20 linear or branched alkyl group; an acyl halide group (—RC(=O)X, wherein R is a substituted or unsubstituted C1 to C20 alkylene group and X is a halogen); —C(=O)OR' (wherein R' is hydrogen or a C1 to C20 linear or branched alkyl group); —CN; or —C(=O)ORR' or —C(=O)ONRR' (wherein R and R' are each independently hydrogen or a C1 to C20 linear or branched alkyl group), $L_1$ is a carbon atom, a substituted or unsubstituted C1 to C30 alkylene group, a substituted or unsubstituted C1 to C30 alkylene group in which at least one methylene (—$CH_2$—) is replaced by sulfonyl (—$SO_2$—), carbonyl (CO), ether bond (—O—), sulfide group (—S—), sulfoxide group (—SO—), ester group (—C(=O)O—), amide group (—C(=O)NR—, wherein R is hydrogen or a C1 to C10 linear or branched alkyl group), or a combination thereof, a substituted or unsubstituted C3 to C30 cycloalkylene group, a substituted or unsubstituted C6 to C30 arylene group, a substituted or unsubstituted C3 to C30 heteroarylene group, or a substituted or unsubstituted C3 to C30 heterocycloalkylene group, $Y_1$ is a single bond; a substituted or unsubstituted C1 to C30 alkylene group; a substituted or unsubstituted C2 to C30 alkenylene group; or a C1 to C30 alkylene group or a C2 to C30 alkenylene group in which at least one methylene (—$CH_2$—) is replaced by sulfonyl (—S(=O)$_2$—), carbonyl (—O(=O)—), ether bond (—O—), sulfide group (—S—), sulfoxide group (—S(=O)—), ester group (—O(=O)O—), amide group (—O(=O)NR—, wherein R is hydrogen or a C1 to C10 linear or branched alkyl group), imine group (—NR—, wherein R is hydrogen or a C1 to C10 linear or branched alkyl group), or a combination thereof, m is an integer of greater than or equal to 1, k1 is 0 or an integer of greater than or equal to 1 and k2 is an integer of greater than or equal to 1, a sum of m and k2 is an integer of greater than or equal to 3, m does not exceed the valence of $Y_1$, and a sum of k1 and k2 does not exceed the valence of $L_1$.

The (multi) thiol compound may be a dithiol compound, a trithiol compound, a tetrathiol compound, or a combination thereof. For example, the thiol compound may be glycol di-3-mercaptopropionate, glycol dimercapto acetate, trimethylolpropane tris (3-mercaptopropionate), pentaerythritol tetrakis (3-mercaptopropionate), pentaerythritol tetrakis (2-mercaptoacetate), 1,6-hexanedithiol, 1,3-propanedithiol, 1,2-ethanedithiol, polyethylene glycol dithiol including 1 to 10 ethylene glycol repeating units, or a combination thereof.

A content of the (multi) thiol compound may be less than or equal to about 60 wt %, less than or equal to about 50 wt %, less than or equal to about 40 wt %, less than or equal to about 30 wt %, less than or equal to about 20 wt %, less than or equal to about 10 wt %, less than or equal to about 9 wt %, less than or equal to about 8 wt %, less than or equal to about 7 wt %, less than or equal to about 6 wt %, or less than or equal to about 5 wt % based on the total weight of the composition (or a total weight of solids). The content of the thiol compound may be greater than or equal to about 0.1 wt %, for example, greater than or equal to about 0.5 wt %, greater than or equal to about 1 wt %, greater than or equal to about 5 wt %, greater than or equal to about 10 wt %, greater than or equal to about 15 wt %, greater than or equal to about 20 wt %, or greater than or equal to about 25 wt % based on the total weight of the composition (or a total weight of solids).

The composition may further include an organic solvent (or liquid vehicle, hereinafter referred to as a solvent). The type of useable solvent is not particularly limited. Non-limiting examples of the solvent or liquid vehicle may be ethyl 3-ethoxy propionate; ethylene glycols such as ethylene glycol, diethylene glycol, polyethylene glycol, and the like; glycolethers such as ethylene glycolmonomethylether, ethylene glycolmonoethylether, diethylene glycolmonomethylether, ethylene glycoldiethylether, diethylene glycoldimethylether, and the like; glycolether acetates such as ethylene glycolmonomethyletheracetate, ethylene glycolmonoethylether acetate, diethylene glycolmonoethylether acetate, diethylene glycolmonobutylether acetate, and the like; propylene glycols such as propylene glycol, and the like; propylene glycolethers such as propylene glycolmonomethylether, propylene glycolmonoethylether, propylene glycolmonopropylether, propylene glycolmonobutylether, propylene glycoldimethylether, dipropylene glycoldimethylether, propylene glycoldiethylether, dipropylene glycoldiethylether, and the like; propylene glycolether acetates such as propylene glycolmonomethyl ether acetate, dipropylene glycolmonoethylether acetate, and the like; amides such as N-methylpyrrolidone, dimethyl formamide, dimethyl acetamide, and the like; ketones such as methylethylketone (MEK), methylisobutylketone (MIBK), cyclohexanone, and the like; petroleum solvents such as solvent naphtha, and the like; esters such as ethyl acetate, butyl acetate, ethyl lactate, and the like; ethers such as tetrahydrofuran, diethyl ether, dipropyl ether, dibutyl ether, and the like, chloroform, C1 to C40 aliphatic hydrocarbon (e.g., alkane, alkene, or alkyne), a halogen- (e.g., chlorine-) substituted C1 to C40 aliphatic hydrocarbon (e.g., dichloroethane, trichloromethane, and the like), C6 to C40 aromatic hydrocarbon (e.g., toluene, xylene, and the like), a halogen- (e.g., chlorine-) substituted C6 to C40 aromatic hydrocarbon; dimethylsulfoxide; or a combination thereof, but are not limited thereto.

The types and contents of the organic solvent may be appropriately determined by considering the aforementioned main components (i.e., the quantum dots, the dispersant, the polymerizable monomer, the initiator, and if used, the thiol compound) and types and contents of additives which is described later. The composition may include a solvent in a residual amount except for a desired content of the (non-volatile) solid.

The composition (e.g., ink composition) may have a viscosity at 25° C. of greater than or equal to about 4 centiPoise (cPs), greater than or equal to about 5 cPs, greater than or equal to about 5.5 cPs, greater than or equal to about 6.0 cPs, or greater than or equal to about 7.0 cPs. The composition may have a viscosity at 25° C. of less than or equal to about 12 cPs, less than or equal to about 10 cPs, or less than or equal to about 9 cPs.

When used for inkjet, the composition may be discharged to a substrate at room temperature, and may be heated, for example, to form a quantum dot-polymer composite film or a pattern thereof. The ink composition, while having the aforementioned viscosity, may have a surface tension at 23° C. of greater than or equal to about 21 milliNewtons per meter (mN/m), greater than or equal to about 22 mN/m, greater than or equal to about 23 mN/m, greater than or equal to about 24 mN/m, greater than or equal to about 25 mN/m, greater than or equal to about 26 mN/m, greater than or equal to about 27 mN/m, greater than or equal to about 28 mN/m, greater than or equal to about 29 mN/m, greater than or equal to about 30 mN/m, or greater than or equal to about 31 mN/m and less than or equal to about 40 mN/m, less than or equal to about 39 mN/m, less than or equal to about 38 mN/m, less than or equal to about 36 mN/m, less than or equal to about 35 mN/m, less than or equal to about 34 mN/m, less than or equal to about 33 mN/m, or less than or equal to about 32 mN/m. The ink composition may have a surface tension of less than or equal to about 31 mN/m, less than or equal to about 30 mN/m, less than or equal to about 29 mN/m, or less than or equal to about 28 mN/m.

In an embodiment, the composition may further include, for example, an additive included in the composition for photoresist or the ink composition. The additive may include a light diffusing agent, a leveling agent, a coupling agent, and the like. For specific details, for example, reference may be made to the contents described in US-2017-0052444-A1.

The composition may be prepared by a method that includes preparing a quantum dot dispersion including the aforementioned quantum dots, dispersant, and/or solvent; and mixing an initiator, a polymerizable monomer (e.g., an acrylic monomer), optionally a thiol compound, metal oxide particulates, and optionally the aforementioned additives in the quantum dot dispersion. Each of the aforementioned components may be mixed sequentially or simultaneously, and the order is not particularly limited.

The composition may be used to provide a quantum dot composite according to an embodiment, for example, a quantum dot-polymer composite. The composition may provide, for example, a quantum dot-polymer composite by radical polymerization. The composition for preparing a quantum dot composite according to an embodiment may be a quantum dot-containing photoresist composition applicable to a photolithography method. The composition according to an embodiment may be an ink composition capable of providing a pattern by a printing method (e.g., a droplet discharging method such as inkjet printing).

Therefore, the quantum dot composite according to an embodiment includes a polymer matrix and the aforementioned quantum dots dispersed in the polymer matrix and is configured to emit green light or red light, wherein the plurality of quantum dots includes a semiconductor nanocrystal core including indium and phosphorus. In addition, in the quantum dot composite according to an embodiment an intensity of a peak from about 350° C. to about 450° C. may be 8 times or more, for example, 9 times or more, or for example, 10 times or more the intensity of a peak from about 200° C. and about 300° C. in a thermogravimetric analysis (TGA) graph as determined with a differential scanning calorimeter (DSC)

As described above, the quantum dots according to an embodiment may have an area of a peak from about 400° C. to about 500° C. that is about 0.17 times, or 0.17 times, or more relative to an area of a peak from about 200° C. to about 300° C. in a thermogravimetric analysis (TGA) graph as determined with a differential scanning calorimeter (DSC). The quantum dot composite according to an embodiment in which plurality of such quantum dots are dispersed in a polymer matrix further includes organic materials included in the polymer matrix as well as two or more types of organic compounds present on the surface of the quantum dots. Accordingly, the thermogravimetric analysis (TGA) analysis result of the quantum dot composite may be different from the TGA analysis result of the quantum dots according to an embodiment and may further include an analysis result of organic materials included in the polymer matrix. As a result of TGA analysis of such a quantum dot composite, the intensity of the peak from about 350° C. to about 450° C. is 8 times or more, for example, 9 times or more, or for example, 10 times or more relative to the intensity of the peak from about 200° C. to about 300° C. From this, it may be interpreted that the quantum dot composite according to an embodiment includes a compound that decomposes at a temperature from about 350° C. and about 450° C. in an amount that is 8 times or more, for example, 9 times or more, or for example 10 times or more than that of another compound that decomposes at a temperature from about 200° C. to about 300° C.

As can be seen from the results of examples and comparative examples to be described later, the quantum dot composite including quantum dots including two or more compounds on the surface in a specific ratio according to an embodiment may further include a specific compound that is not included in the quantum dot composite according to comparative examples or that is included in a very small amount compared to the compound included in a relatively large amount, compared to the quantum dot composite including the quantum dots of comparative examples that include one compound alone on the surface, or even include two or more compounds wherein one compound is included in a very small amount compared to the other compound. The temperature range at which such specific compounds is decomposed falls from about 350° C. and about 450° C., and thus, in the quantum dot composite according to an embodiment, the intensity of the peak from about 350° C. and about 450° C. may be higher, compared to the TGA graph of the quantum dot composite according to the comparative examples each of which is prepared with the same polymer matrix. In addition, the quantum dot composite according to an embodiment also includes one type of compound on the surface of the quantum dot of comparative examples in addition to the specific compound that decomposes from about 350° C. and about 450° C. Since the temperature at which the compound is decomposed is from about 200° C. and about 300° C., a small peak is shown even in the temperature range from about 200° C. and about 300° C. in the TGA graph. Therefore, in the quantum dot composite according to an embodiment, the peak from about 350° C. and about 450° C. is about 8 times higher (i.e., stronger) compared to the small peak from about 200° C. and about 300° C. For example, the quantum dot composite according to an embodiment has a peak intensity from about 350° C. and about 450° C. that is in the range of about 9 times or more, for example, about 10 times or more, about 11 times or more, or about 12 times or more, and for example, to about 13 times or less, to about 12 times or less, or to about 11 times or less, compared to a peak intensity from about 200° C. and about 300° C.

In addition, it may be confirmed that the quantum dot composites according to comparative examples, which includes substantially only one ligand of the two compounds on the surface of the quantum dots in the quantum dot composite according to an embodiment or most of the one compound as a main component, and includes, the same polymer matrix, exhibit the intensity of the peak present from about 350° C. and about 450° C. is less than about 8 times, for example, about 7.95 times or less, for example, about 7.5 times or less, for example, about 7 times or less the intensity of the peak present from about 200° C. and about 300° C., in the TGA graph measured by DSC. From this, it is interpreted that the quantum dots according to the comparative examples do not include, or includes a very small amount of a compound that is decomposed from about 350° C. to about 450° C. Accordingly, most of one type of compound present as a main component on the surface of the quantum dots is decomposed from about 200° C. and about 300° C., and thus the intensity of the peak from about 200° C. and about 300° C. appears higher than the peak in the same temperature range on the TGA graph of the quantum dot composite according to an embodiment. On the other hand, because most of the peaks from about 350° C. to about 450° C. appear by decomposition of the polymer matrix material, a ratio of a height of the peak from about 350° C. to about 450° C. relative to a height of the peak from about 200° C. and about 300° C. is lower compared to the quantum dot composite according to an embodiment Without intending to be bound by a particular theory, as can be seen from the TGA analysis result, the quantum dot composite including quantum dots according to an embodiment has different properties from the quantum dot composite including quantum dots according to comparative examples, and therefore, it is thought that excellent light emitting characteristics of high luminance and high color purity are maintained with little, if any, decrease (or reduction) in luminance even when driven for an extended time under a high-luminance light source.

In an embodiment, the plurality of quantum dots included in the quantum dot composite may further include a semiconductor nanocrystal shell including zinc, selenium, and sulfur, which is disposed on the semiconductor nanocrystal core including indium and phosphorus. The quantum dot composite according to an embodiment including such quantum dots may include about 0.5 wt % to about 2.5 wt % of indium, about 10 wt % to about 25 wt % of zinc, about 4.5 wt % to about 15 wt % of selenium, and about 5 wt % to about 15 wt % of sulfur based on the total weight of the quantum dot composite.

The contents of the elements in the quantum dot complex can be confirmed through ICP emission spectroscopy or the like.

Furthermore, in the quantum dot composite according to an embodiment, the plurality of quantum dots further include a semiconductor nanocrystal shell disposed on the semiconductor nanocrystal core and including zinc, selenium, and sulfur, and when the plurality of quantum dots are green light-emitting quantum dots, a mole ratio of zinc to a total moles of selenium and sulfur (i.e., (Zn:(Se+S)) in the quantum dot composite is greater than or equal to about 1.12:1, as determined by ICP emission spectroscopy, but when the plurality of quantum dots are red light-emitting quantum dots, the mole ratio (Zn:(Se+S)). i.e., of zinc based on the total mols of selenium and sulfur in the quantum dot composite may be greater than or equal to about 1.0:1, as determined by ICP emission spectroscopy.

As described above, the quantum dot composite according to an embodiment includes quantum dots including a compound having a thiol group and a compound having a carboxyl group on the surface, of which an area of peaks within a specific temperature range in the TGA graph measured by DSC may satisfy a specific area ratio, and thus may have a content of elements different from that of the same elements of a quantum dot composite including quantum dots but does not satisfy the area ratio of peaks within the specific temperature range in the TGA graph.

In particular, the quantum dot composite according to an embodiment includes quantum dots additionally surface-modified through an exchange reaction, and thereby, substituting a portion of a ligand of the quantum dots having a carboxyl group such as oleic acid and the like, which is added during the preparation of the quantum dots, with a compound having a thiol group, wherein these quantum dots may include a small amount of a thiol group (—SH), that is, sulfur (S), compared with that of quantum dots in which the oleic acid is fully substituted with the compound having a thiol group. Accordingly, the quantum dot composite according to an embodiment may contain less sulfur due to the additional surface modification than the quantum dot composite including the quantum dots in which ligands such as oleic acid and the like are mostly substituted with the compound having a thiol group, and thereby, have a relatively higher mole ratio of zinc to a total moles of sulfur and selenium than that of the quantum dot composite including the quantum dots in which the ligands are mostly substituted with the compound having a thiol group. For example, the quantum dot composite including the quantum dots mostly having the compound having a thiol group on the surface, when the quantum dots are green light-emitting quantum dots, has a mole ratio (Zn:(Se+S)), i.e., moles of zinc to the total moles of sulfur and selenium of less than about 1.12:1, for example, about 1.11:1, as determined by ICP emission spectroscopy.

On the other hand, when the quantum dots are red light-emitting quantum dots, the quantum dot composite has a mole ratio of moles of zinc to the total moles of sulfur and selenium of less than about 1.0:1, for example, about 0.95:1, wherein the reason may be that the quantum dot composite including the quantum dots including a larger amount the ligand having a thiol group on the surface may have a content ratio difference among elements due to a higher content of a sulfur (S) element derived from the thiol group (—SH).

Based on the total weight of the quantum dot composite, the content of the plurality of quantum dots may be greater than or equal to about 10 wt %, greater than or equal to about 20 wt %, greater than or equal to about 30 wt %, greater than or equal to about 40 wt %, greater than or equal to about 50 wt %, or greater than or equal to about 60 wt %, for example, greater than or equal to about 10 wt % and less than or equal to about 60 wt %, greater than or equal to about 15 wt % and less than or equal to about 60 wt %, greater than or equal to about 20 wt % and less than or equal to about 60 wt %, greater than or equal to about 25 wt % and less than or equal to about 60 wt %, greater than or equal to about 30 wt % and less than or equal to about 60 wt %, greater than or equal to about 30 wt % and less than or equal to about 55 wt %, greater than or equal to about 35 wt % and less than or equal to about 55 wt %, greater than or equal to about 40 wt % and less than or equal to about 55 wt %, greater than or equal to about 45 wt % and less than or equal to about 60 wt %, greater than or equal to about 45 wt % and less than or equal to about 55 wt %, or about 50 wt %, but is not limited thereto.

Based on the total weight of the quantum dot composite, the content of the matrix may be greater than or equal to about 10 wt %, greater than or equal to about 20 wt %, greater than or equal to about 30 wt %, greater than or equal to about 40 wt %, greater than or equal to about 50 wt %, greater than or equal to about 60 wt %, or greater than or equal to about 70 wt % and less than or equal to about 90 wt %, less than or equal to about 80 wt %, less than or equal to about 70 wt %, less than or equal to about 60 wt %, less than or equal to about 50 wt %, or less than or equal to about 40 wt %, for example, greater than or equal to about 10 wt % and less than or equal to about 90 wt %, greater than or equal to about 20 wt % and less than or equal to about 85 wt %, greater than or equal to about 25 wt % and less than or equal to about 80 wt %, greater than or equal to about 30% and less than or equal to about 75 wt %, greater than or equal to about 30 wt % and less than or equal to about 70 wt %, greater than or equal to about 30 wt % and less than or equal to about 65 wt %, greater than or equal to about 30 wt % and less than or equal to about 60 wt %, greater than or equal to about 30 wt % and less than or equal to about 55 wt %, greater than or equal to about 35 wt % and less than or equal to about 55 wt %, greater than or equal to about 35 wt % and less than or equal to about 50 wt %, greater than or equal to about 30 wt % and less than or equal to about 45 wt %, greater than or equal to about 30 wt % and less than or equal to about 40 wt %, or greater than or equal to about 35 wt % and less than or equal to about 45 wt %, but is not limited thereto.

The (polymer) matrix may include a crosslinked polymer and/or a linear polymer. The crosslinked polymer may include a thiolene resin, a crosslinked poly(meth)acrylate, a crosslinked polyurethane, a crosslinked epoxy resin, a crosslinked vinyl polymer, a crosslinked silicone resin, or a combination thereof. The linear polymer may include a carboxylic acid-containing repeating unit.

The matrix may include the aforementioned dispersant (e.g., a carboxyl group-containing monomer or polymer), a polymerization product of a polymerizable monomer including at least one carbon-carbon double bond, for example 2 or more, 3 or more, 4 or more, or 5 or more, such as an insulating polymer, and optionally a polymerization product between the polymerizable monomer and thiol compounds having at least one, for example, two or more thiol groups at the terminal end.

In an embodiment, the polymer matrix may include a crosslinked polymer, a linear polymer, or a combination thereof. The crosslinked polymer may include a thiolene resin, a crosslinked poly(meth)acrylate, or a combination thereof. In an embodiment, the crosslinked polymer may be a polymerization product of the aforementioned polymerizable monomer, and optionally a (multi) thiol compound. Details for the quantum dots, dispersants, polymerizable monomers, and descriptions of the (multi) thiol compound are the same as described above.

The quantum dot composite may be in the form of a film, for example, in the form of a patterned film. The patterning may be performed using a photolithographic method or the like by including photocurable materials as the dispersant or the photopolymerizable monomer in the composition for preparing the quantum dot composite. Alternatively, it may be printed in a patterned form through an inkjet printing process or the like. This is described in more detail below.

A display panel according to another embodiment may include the quantum dot composite. The display panel may include a color conversion layer including a plurality of regions including a color conversion region, and the aforementioned quantum dot composite according to the embodiment may be disposed in the color conversion region in the color conversion layer. In an embodiment, the color conversion layer may further include a partition wall defining the plurality of regions.

In an embodiment, the display panel may further include a light emitting panel including a light emitting source, and the color conversion layer may convert an emission spectrum of light emitted from the light emitting panel. For example, the color conversion layer may absorb blue light emitted from the light emitting source and convert it into green light or red light.

In an embodiment, the color conversion layer may be in a form of a patterned film.

In an embodiment, the color conversion region of the color conversion layer may include at least one first region (hereinafter also referred to as a first partition) configured to convert the light irradiated by the excitation light into light of a first emission spectrum, and the first region may include the quantum dot composite according to an embodiment. The color conversion layer may be in a form of a quantum dot composite patterned film.

The color conversion region may include a (e.g., one or more) second region (hereinafter also referred to as a second partition) configured to emit a second light different from the first light (e.g., by irradiation of excitation light). The second region may include a quantum dot composite according to an embodiment.

The quantum dot composite in the second region may include quantum dots that emit light of a different wavelength (e.g., a different color) from the quantum dot composite in the first region.

The first light or the second light may be red light having an emission peak wavelength of about 610 nm to about 660 nm (e.g., about 620 nm to about 650 nm), or green light having an emission peak wavelength of about 500 nm to about 550 nm (e.g., about 510 nm to about 540 nm). The color conversion layer may further include (at least one) a third region (hereinafter also referred to as a third partition) that emits or passes a third light (e.g., blue light) different from the first light and the second light. The third light may include excitation light. The third light may include blue light having an emission peak wavelength in a range of about 430 nm to about 470 nm.

In an embodiment, in the first region configured to emit the first light, that is, red light having an emission peak wavelength of about 610 nm to about 660 nm (e.g., about 620 nm to about 650 nm) in the color conversion region, the content of indium may be about 1 wt % to about 1.5 wt %, the content of zinc may be about 10 wt % to about 20 wt %, the content of selenium may be about 5 wt % to about 10 wt %, and the content of sulfur may be about 5 wt % to about 10 wt % based on the total weight of the materials forming the first region.

In an embodiment, in the second region configured to emit the second light, that is, green light having an emission peak wavelength of about 500 nm to about 550 nm (e.g., about 510 nm to about 540 nm), in the color conversion region, the content of indium may be about 0.5 wt % to about 2 wt %, the content of zinc may be about 15 wt % to about 25 wt %, the content of selenium may be about 4.5 wt % to about 15 wt %, and the content of sulfur may be about 6 wt % to about 15 wt % based on the total weight of the materials forming the second region.

The content of the elements in the color conversion region in the color conversion layer of the display panel may be confirmed through ICP emission spectroscopy or the like.

The color conversion layer (or the patterned film of the quantum dot composite) may be produced using a photoresist composition. This method may include forming a film of the composition for preparing a quantum dot composite according to an embodiment on a substrate (S1); prebaking the film according to selection (S2); exposing a selected region of the film to light (e.g., having a wavelength of less than or equal to about 400 nm) (S3); and developing the exposed film with an alkali developing solution to obtain a pattern of a quantum dot polymer composite (S4).

Referring to FIG. 1A, the aforementioned composition is applied to a predetermined thickness on a substrate using an appropriate method such as spin coating or slit coating to form a film (S1). The formed film may be optionally subjected to a pre-baking (PRB) (S2). The pre-baking may be performed by selecting an appropriate condition from known conditions of a temperature, time, an atmosphere, and the like.

The formed (or optionally prebaked) film is exposed to light having a predetermined wavelength under a mask having a predetermined pattern (S3). A wavelength and intensity of the light may be selected considering types and contents of the photoinitiator, types and contents of the quantum dots, and the like.

The exposed film is treated with an alkali developing solution (e.g., dipping or spraying) to dissolve an unexposed region and obtain a desired pattern (S4). The obtained pattern may be, optionally, post-baked (FOB) to improve crack resistance and solvent resistance of the pattern, for example, at a temperature of about 150° C. to about 230° C. for a predetermined time (e.g., greater than or equal to about 10 minutes or greater than or equal to about 20 minutes) (S5).

When the color conversion layer or the patterned film of the quantum dot composite has a plurality of repeating partitions (that is, color conversion regions), each repeating partition may be formed by preparing a plurality of compositions including quantum dots (e.g., red light-emitting quantum dots, green light-emitting quantum dots, or optionally, blue light-emitting quantum dots) having desired luminous properties (emission peak wavelength and the like) and repeating the aforementioned pattern-forming process as many times as necessary (e.g., 2 times or more, or 3 times or more) for each composition, to provide a quantum dot-polymer composite having a desired pattern. For example, the quantum dot-polymer composite may have a pattern of at least two repeating color partitions (e.g., RGB color partitions) (S6). This quantum dot-polymer composite pattern may be used as a photoluminescence-type color filter in a display device.

Figure 1B:
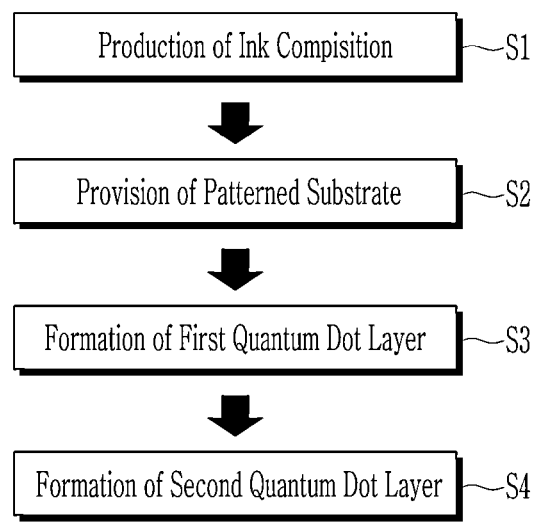
FIG. 1B schematically shows a pattern forming process using an ink composition as a form of a quantum dot composite according to an embodiment.

The color conversion layer or the patterned film of the quantum dot composite may be produced using an ink composition configured to form a pattern in an inkjet manner. Referring to FIG. 1B, such a method may include preparing an ink composition according to an embodiment (S1), providing a substrate (e.g., with pixel areas patterned by electrodes and optionally banks, etc.) (S2), depositing an ink composition on the substrate (or the pixel region) to form, for example, a first quantum dot layer (or first region) (S3); and depositing an ink composition on the substrate (or the pixel region) to form, for example, a second quantum dot layer (or second region) (S4). The forming of the first quantum dot layer and the forming of the second quantum dot layer are simultaneously or sequentially carried out.

The depositing of the ink composition may be performed using an appropriate liquid drop discharger, for example an inkjet or nozzle printing system having an ink storage and at least one print head. The deposited ink composition may provide a first or second quantum dot layer through the solvent removal and polymerization by the heating. The method may provide a highly precise quantum dot-polymer composite film or patterned film for a short time by the simple method.

The aforementioned quantum dots or quantum dot composite (pattern) may be included in an electronic device. Such an electronic device may include, but are not limited to, a display device, a light emitting diode (LED), an organic light emitting diode (OLED), a quantum dot LED, a sensor, a solar cell, an imaging sensor, a photodetector, or a liquid crystal display device. The aforementioned quantum dots may be included in an electronic apparatus. Such an electronic apparatus may include a portable terminal device, a monitor, a notebook computer, a television, an electric sign board, a camera, a VR (virtual reality) or AR (augmented reality) device, a car, and the like, but is not limited thereto. The electronic apparatus may be a portable terminal device including a display device (or a light emitting device) including quantum dots, a monitor, a notebook computer, an electronic display board, a television, a VR (virtual reality), AR (augmented reality) device, and the like. The electronic apparatus may be a camera or a mobile terminal device including an image sensor including quantum dots. The electronic apparatus may be a camera or a vehicle including a photodetector including quantum dots.

Hereinafter, the display panel and the color conversion panel will be described in more detail with reference to the drawings.

Figure 2:
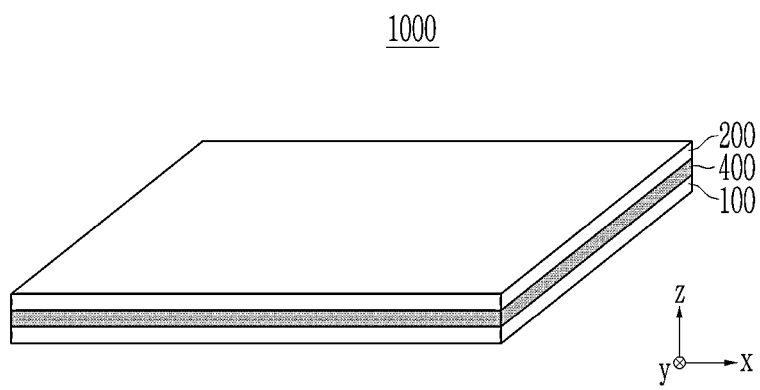
FIG. 2 is a perspective view illustrating an example of a display panel according to an embodiment.
Figure 3:
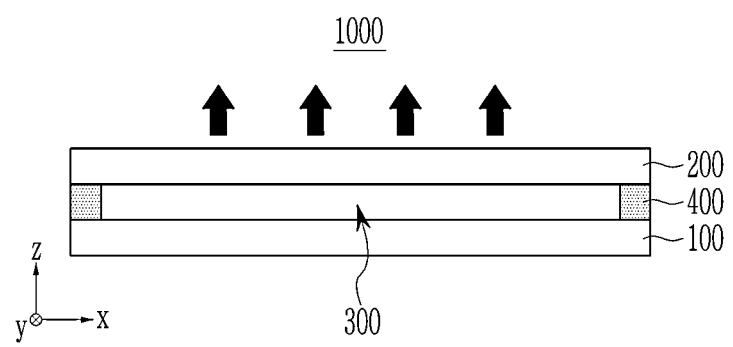
FIG. 3 is a cross-sectional view of the display panel of FIG. 2.

Referring to FIGS. 2 and 3, a display panel 1000 according to an embodiment includes a light emitting panel 100, a color conversion panel 200, a light transmitting layer 300 disposed between the light emitting panel 100 and the color conversion panel 200, and a binder 400 bonding the light emitting panel 100 and the color conversion panel 200.

The light emitting panel 100 and the color conversion panel 200 may each have a surface that faces the other with the light transmitting layer 300 therebetween, and the color conversion panel 200 may be disposed in a direction in which light is emitted from the light emitting panel 100 as depicted by the solid arrows. The binder (hereinafter, also referred to as binding element) 400 may be disposed along the edges of the light emitting panel 100 and the color conversion panel 200, and may be, for example, a sealant.

In FIGS. 2 and 3, the light transmitting layer 300 is disposed between the light emitting panel 100 and the color conversion panel 200, and the binder 400 is disposed along the edges of the light emitting panel 100 and the color conversion panel 200. However, the light transmitting layer 300 and the binder 400 may be omitted and are not necessarily included. That is, the light emitting panel 100 and the color conversion panel 200 may be directly coupled without interposing the light transmitting layer 300.

Figure 4:
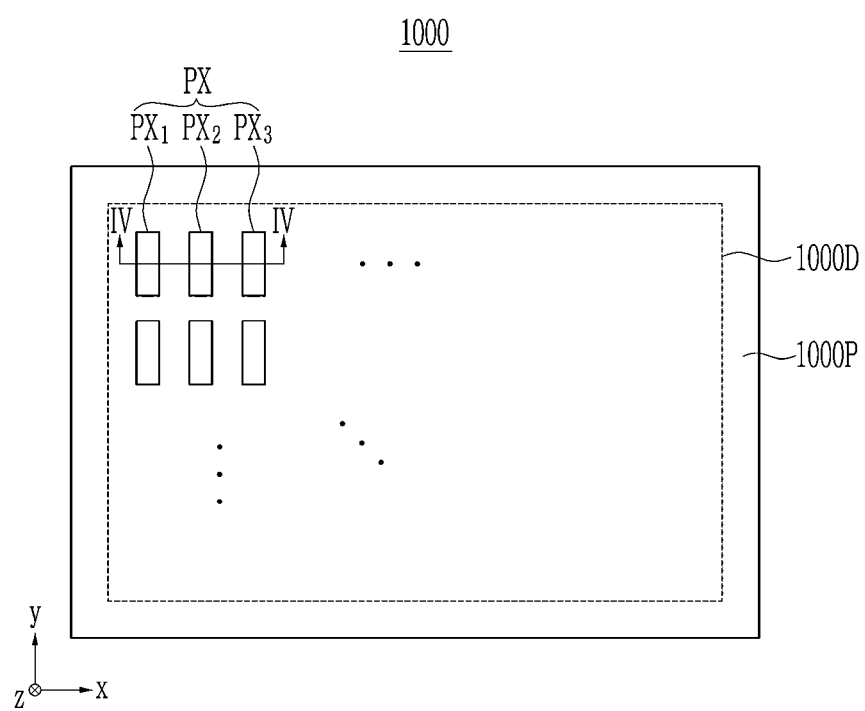
FIG. 4 is a plan view illustrating an example of a pixel arrangement of the display panel of FIG. 2.

Referring to FIG. 4, a display panel 1000 according to an embodiment includes a display area 1000D for displaying an image and a non-display area 1000P disposed around the display area 1000D and in which the binding element 400 is disposed.

The display area 1000D may include a plurality of pixels PXs arranged along a row (e.g., x direction) and/or a column (e.g., y direction), and each pixel PX may include a plurality of subpixels $PX_1$, $PX_2$, and $PX_3$ displaying different colors. Herein, as an example, a configuration in which three subpixels $PX_1$, $PX_2$, and $PX_3$ constitute one pixel PX is illustrated, but the configuration is not limited thereto. An additional subpixel such as a white subpixel may be further included, and one or more subpixel displaying the same color may be included. The plurality of pixels PXs may be arranged in, for example, a Bayer matrix, a PenTile matrix, and/or a diamond matrix, but is not limited thereto.

Each of the subpixels $PX_1$, $PX_2$, and $PX_3$ may be configured to display a color of three primary colors or a combination of three primary colors, for example, red, green, blue, or a combination thereof. For example, the first subpixel $PX_1$ may be configured to display red, the second subpixel $PX_2$ may be configured to display green, and the third subpixel $PX_3$ may be configured to display blue.

In the drawing, an example in which all subpixels have the same size is illustrated, but the present disclosure is not limited thereto. At least one of the subpixels may be larger or smaller than the other subpixels. In the drawing, an example in which all subpixels have the same shape is illustrated, but the present disclosure is not limited thereto. At least one of the subpixels may have a different shape from other subpixels.

The light emitting panel 100 and the color conversion panel 200 will be described with reference to FIG. 5.

The light emitting panel 100 may include a light emitting device that emits light in a predetermined wavelength region and a circuit device for switching and/or driving the light emitting device. Specifically, the light emitting panel 100 may include a lower substrate 110, a buffer layer 111, a thin film transistor TFT, a light emitting device 180, and an encapsulation layer 190.

The lower substrate 110 may be a glass substrate or a polymer substrate. The polymer substrate may include, for example, polyimide, polyamide, polyamide-imide, polyethylene terephthalate, polyethylene naphthalene, polymethyl methacrylate, polycarbonate, a copolymer thereof, or a combination thereof, but is not limited thereto.

The buffer layer 111 may include an organic material, an inorganic material, or an organic-inorganic material. The buffer layer 111 may include, for example, an oxide, a nitride, or an oxynitride, and may include, for example, silicon oxide, silicon nitride, silicon oxynitride, or a combination thereof, but is not limited thereto. The buffer layer 111 may be one layer or two or more layers, and may cover the whole surface of the lower substrate 110. The buffer layer 111 may be omitted.

The thin film transistor TFT may be a three terminal element for switching and/or driving the light emitting device 180, which will be described later, and one or two or more may be included for each subpixel. The thin film transistor TFT may include a gate electrode 124, a semiconductor layer 154 overlapped with the gate electrode 124, a gate insulating layer 140 between the gate electrode 124 and the semiconductor layer 154, and a source electrode 173 and a drain electrode 175 electrically connected to a semiconductor layer 154. In the drawings, a coplanar top gate structure is shown as an example, but the structure is not limited thereto and may have various structures.

The gate electrode 124 is electrically connected to a gate line (not shown), and may include, for example, a low-resistance metal such as aluminum (Al), molybdenum (Mo), copper (Cu), titanium (Ti), silver (Ag), gold (Au), an alloy thereof, or a combination thereof, but is not limited thereto.

The semiconductor layer 154 may be an inorganic semiconductor such as amorphous silicon, polycrystalline silicon, or oxide semiconductor; an organic semiconductor; an organic-inorganic semiconductor; or a combination thereof. For example, the semiconductor layer 154 may include an oxide semiconductor including at least one of indium (In), zinc (Zn), tin (Sn), and gallium (Ga), and the oxide semiconductor may include, for example, indium-gallium-zinc oxide, zinc-tin oxide, or a combination thereof, but they are not limited thereto. The semiconductor layer 154 may include a channel region and doped regions disposed on both sides of the channel region and electrically connected to the source electrode 173 and the drain electrode 175, respectively.

The gate insulating layer 140 may include an organic material, an inorganic material, or an organic-inorganic material, and may include, for example, an oxide, a nitride, or an oxynitride, and may include, for example, silicon oxide, silicon nitride, silicon oxynitride, or a combination thereof, but is not limited thereto. In the drawing, an example in which the gate insulating layer 140 is formed on the whole surface of the lower substrate 110 is illustrated, but the present disclosure is not limited thereto and may be optionally formed between the gate electrode 124 and the semiconductor 154. The gate insulating layer 140 may be formed of one or two or more layers.

The source electrode 173 and the drain electrode 175 may include, for example, a low-resistance metal such as aluminum (Al), molybdenum (Mo), copper (Cu), titanium (Ti), silver (Ag), gold (Au), an alloy thereof, or a combination thereof, but are not limited thereto. The source electrode 173 and the drain electrode 175 may be electrically connected to the doped regions of the semiconductor layer 154, respectively. The source electrode 173 is electrically connected to a data line (not shown), and the drain electrode 175 is electrically connected to a light emitting device 180 to be described later.

An interlayer insulating layer 145 is additionally formed between the gate electrode 124 and the source/drain electrodes 173 and 175. The interlayer insulating layer 145 may include an organic material, an inorganic material, or an organic-inorganic material, for example, oxide, nitride, or oxynitride, for example, silicon oxide, silicon nitride, silicon oxynitride, or a combination thereof, but is not limited thereto. The interlayer insulating layer 145 may be formed of one or two or more layers.

A protective layer 160 is formed on the thin film transistor TFT. The protective layer 160 may be, for example, a passivation layer. The protective layer 160 may include an organic material, an inorganic material, or an organic-inorganic material, for example, polyacrylic, polyimide, polyamide, polyamide-imide, or a combination thereof, but is not limited thereto. The protective layer 160 may be formed of one or two or more layers.

The light emitting device 180 may be disposed for each subpixel $PX_1$, $PX_2$, and $PX_3$, and the light emitting device 180 disposed in each subpixel $PX_1$, $PX_2$, and $PX_3$ may be independently driven. The light emitting device 180 may be, for example, a light emitting diode, and may include a pair of electrodes and a light emitting layer between the pair of electrodes. The light emitting layer may include a light emitting body capable of emitting light in a predetermined wavelength region, and for example, may include a light emitting body that emits light in a first emission spectrum belonging to a visible wavelength spectrum. The light emitting body may include an organic light emitting body, an inorganic light emitting body, an organic-inorganic light emitting body, or a combination thereof, and may be one type or two or more types.

The light emitting device 180 may be, for example, an organic light emitting diode, an inorganic light emitting diode, or a combination thereof. The inorganic light emitting diode may be, for example, a quantum dot light emitting diode, a perovskite light emitting diode, a micro light emitting diode, an inorganic nano light emitting diode, or a combination thereof, but is not limited thereto.

Figure 6:
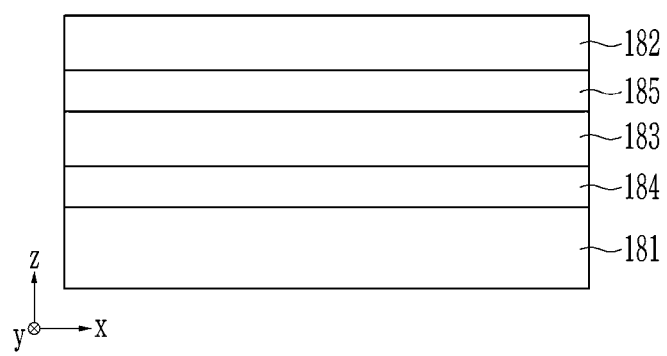
FIGS. 6 to 8 are cross-sectional views each showing an example of a light emitting device.
Figure 7:
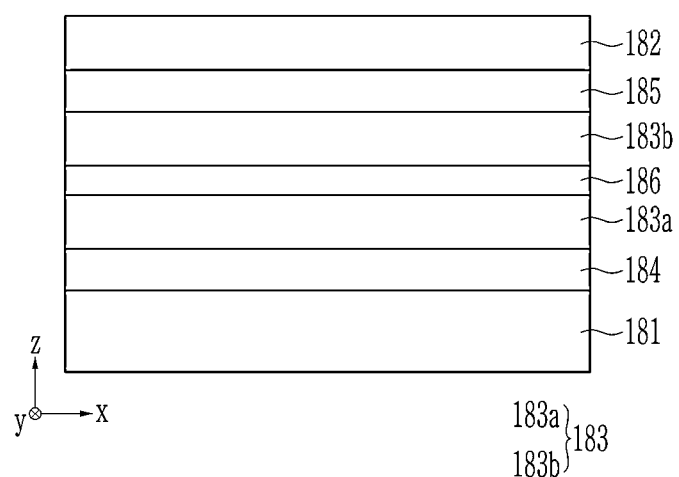
Figure 8:
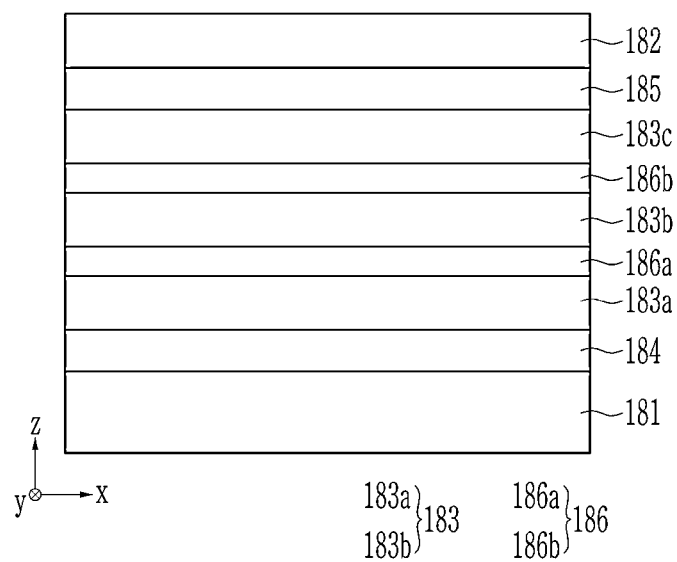

FIGS. 6 to 8 are cross-sectional views showing examples of light emitting devices, respectively.

Referring to FIG. 6, the light emitting device 180 includes a first electrode 181 and a second electrode 182 facing each other; a light emitting layer 183 between the first electrode 181 and the second electrode 182; and optionally auxiliary layers 184 and 185 between the first electrode 181 and the light emitting layer 183 and between the second electrode 182 and the light emitting layer 183.

The first electrode 181 and the second electrode 182 may each with a surface positioned to face the other along a thickness direction (for example, z direction), and any one of the first electrode 181 and the second electrode 182 may be an anode and the other may be a cathode. The first electrode 181 may be a light transmitting electrode, a transflective electrode, or a reflecting electrode, and the second electrode 182 may be a light transmitting electrode or a transflective electrode. The light transmitting electrode or transflective electrode may be, for example, made of a single layer or multiple layers of metal thin film including conductive oxides such as indium tin oxide (ITO), indium zinc oxide (IZO), zinc oxide (ZnO), tin oxide (SnO), aluminum tin oxide (AlTO), and fluorine-doped tin oxide (FTO) or silver (Ag), copper (Cu), aluminum (Al), magnesium (Mg), magnesium-silver (Mg—Ag), magnesium-aluminum (Mg—Al), or a combination thereof. The reflecting electrode may include a metal, a metal nitride, or a combination thereof, for example, silver (Ag), copper (Cu), aluminum (Al), gold (Au), titanium (Ti), chromium (Cr), nickel (Ni), an alloy thereof, a nitride thereof (e.g., TiN), or a combination thereof, but is not limited thereto.

The light emitting layer 183 may include a light emitting body capable of emitting light of a specific wavelength. The specific wavelength may belong to a relatively short wavelength region of the visible light wavelength spectrum, and may be, for example, a blue light emission wavelength (and a green light emission wavelength if selected). The maximum emission wavelength of the blue emission may belong to a wavelength range of greater than or equal to about 400 nm and less than about 500 nm, and may belong to a wavelength range of about 410 nm to about 490 nm or about 420 nm to about 480 nm within the above range. The light emitting body may be one or two or more.

For example, the light emitting layer 183 may include a host material and a dopant material.

For example, the light emitting layer 183 may include a phosphorescent material, a fluorescent material, or a combination thereof.

For example, the light emitting body may include an organic light emitting body, and the organic light emitting body may be a low molecular weight compound, a polymer, or a combination thereof. When the light emitting body includes an organic light emitting body, the light emitting device 180 may be an organic light emitting diode.

For example, the light emitting body may include an inorganic light emitting body, and the inorganic light emitting body may be an inorganic semiconductor, quantum dot, perovskite, or a combination thereof. When the light emitting body includes an inorganic light emitting body, the light emitting device 180 may be a quantum dot light emitting diode, a perovskite light emitting diode, a micro light emitting diode, or a nano light emitting diode, but is not limited thereto.

The auxiliary layers 184 and 185 may be disposed between the first electrode 181 and the light emitting layer 183 and between the second electrode 182 and the light emitting layer 183, respectively, and may be a charge auxiliary layer to control injection and/or mobility of charges, respectively. Each of the auxiliary layers 184 and 185 may be one or two or more layers, and may be, for example, a hole injection layer, a hole transport layer, an electron blocking layer, an electron injection layer, an electron transport layer, a hole blocking layer, or a combination thereof. At least one of the auxiliary layers 184 and 185 may be omitted.

The light emitting devices 180 disposed in each of the subpixels $PX_1$, $PX_2$, and $PX_3$ may be the same or different from each other. The light emitting devices 180 disposed in each of the subpixels $PX_1$, $PX_2$, and $PX_3$ may emit light of the same emission spectrum, for example, each may emit light of a blue emission spectrum, for example, light of a blue emission spectrum having a maximum emission wavelength in a wavelength region of greater than or equal to about 400 nm and less than about 500 nm, about 410 nm to about 490 nm, or about 420 nm to about 480 nm. The light emitting devices 180 disposed in each of the subpixels $PX_1$, $PX_2$, and $PX_3$ may or may not be separated by a pixel defining layer (not shown).

Referring to FIG. 7, the light emitting device 180 may be a light emitting device having a tandem structure, and includes a first electrode 181 and a second electrode 182 facing each other; a first light emitting layer 183a and a second light emitting layer 183b between the first electrode 181 and the second electrode 182; a charge generation layer 186 between the first light emitting layer 183a and the second light emitting layer 183b, and optionally auxiliary layers 184 and 185 between the first electrode 181 and the first light emitting layer 183a and between the second electrode 182 and the second light emitting layer 183b.

The first electrode 181, the second electrode 182, and the auxiliary layers 184 and 185 are as described above.

The first light emitting layer 183a and the second light emitting layer 183b may emit light having the same or different emission spectrum, and, for example, each may emit light having a blue emission spectrum. Detailed descriptions are the same as the light emitting layer 183 described above.

The charge generation layer 186 may inject electric charges into the first light emitting layer 183a and/or the second light emitting layer 183b, and may control a charge balance between the first light emitting layer 183a and the second light emitting layer 183b. The charge generation layer 186 may include, for example, an n-type layer and a p-type layer, and may include, for example, an electron transport material and/or a hole transport material including an n-type dopant and/or a p-type dopant. The charge generation layer 186 may be one layer or two or more layers.

Referring to FIG. 8, the light emitting device 180 may be a light emitting device having a tandem structure such as a stacked structure, and includes a first electrode 181 and a second electrode 182 each with a surface that faces the other; a first light emitting layer 183a, a second light emitting layer 183b, and a third light emitting layer 183c between the first electrode 181 and the second electrode 182; a first charge generation layer 186a between the first light emitting layer 183a and the second light emitting layer 183b; a second charge generation layer 186b between the second light emitting layer 183b and the third light emitting layer 183c; and optionally, auxiliary layers 184 and 185 between the first electrode 181 and the first light emitting layer 183a and between the second electrode 182 and the third light emitting layer 183c, respectively.

The first electrode 181, the second electrode 182, and the auxiliary layers 184 and 185 are as described above.

The first light emitting layer 183a, the second light emitting layer 183b, and the third light emitting layer 183c may emit light having the same or different emission spectrum, and, for example, each may emit light having a blue emission spectrum. Detailed descriptions are the same as the light emitting layer 183 described above.

The first charge generation layer 186a may inject electric charges into the first light emitting layer 183a and/or the second light emitting layer 183b, and may control charge balances between the first light emitting layer 183a and the second light emitting layer 183b. The second charge generation layer 186a may inject electric charges into the second light emitting layer 183b and/or the third light emitting layer 183c, and may control charge balances between the second light emitting layer 183b and the third light emitting layer 183c. Each of the first and second charge generation layers 186a and 186b may be one layer or two or more layers.

Figure 5:
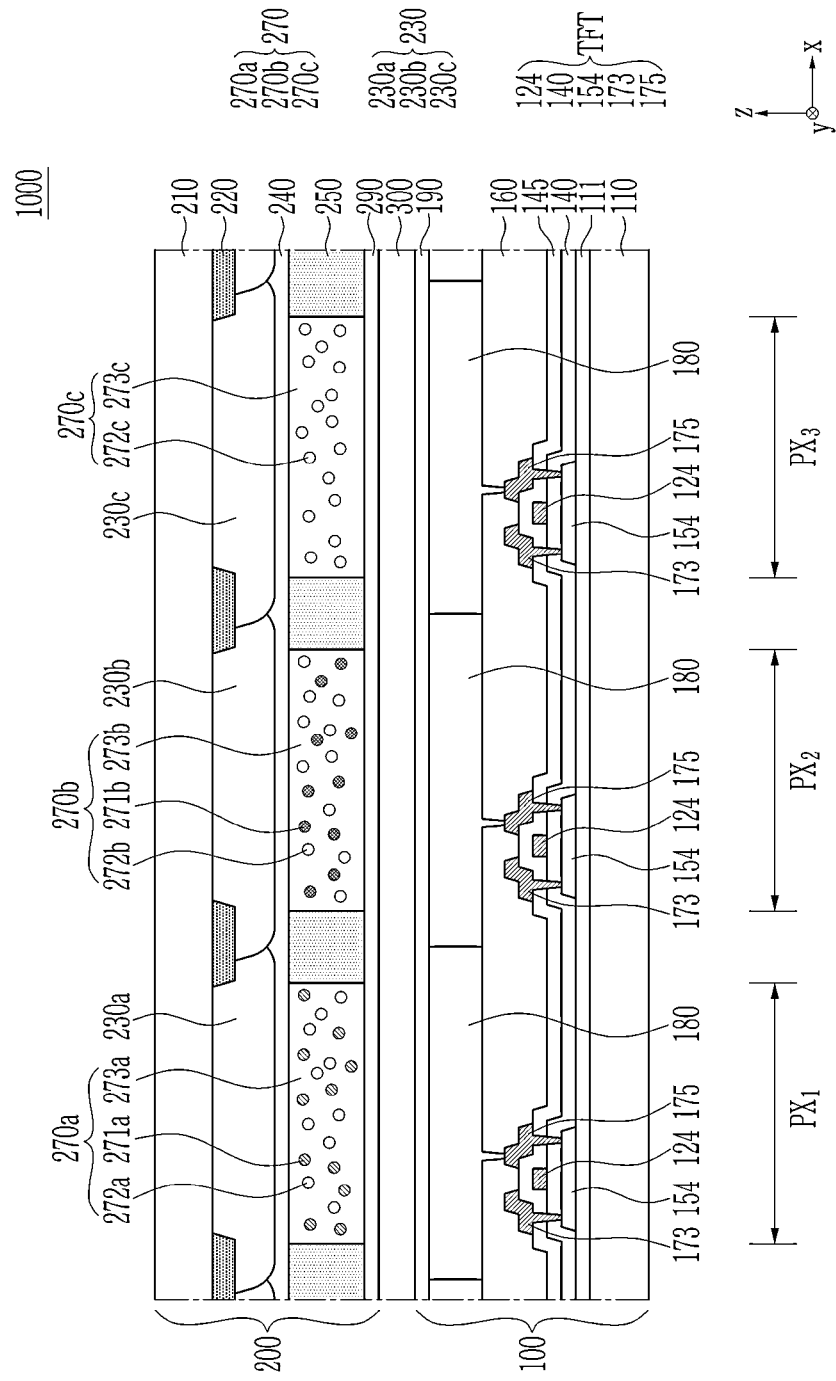
FIG. 5 is a cross-sectional view of the display panel of FIG. 4 taken along line IV-IV.

Referring to FIG. 5, the encapsulation layer 190 covers the light emitting device 180 and may include a glass plate, a metal thin film, an organic film, an inorganic film, an organic-inorganic film, or a combination thereof. The organic film may include, for example, an acrylic resin, a (meth)acrylic resin, a polyisoprene, a vinyl resin, an epoxy resin, a urethane resin, a cellulose resin, a perylene resin, or a combination thereof, but is not limited thereto. The inorganic film may include, for example, an oxides, a nitride, and/or an oxynitride, for example silicon oxide, silicon nitride, silicon oxynitride, aluminum oxide, aluminum nitride, aluminum oxynitride, zirconium oxide, zirconium nitride, zirconium oxynitride, titanium oxide, titanium nitride, titanium oxynitride, hafnium oxide, hafnium nitride, hafnium oxynitride, tantalum oxide, tantalum nitride, tantalum oxynitride, lithium fluoride, or a combination thereof, but is not limited thereto. The organic-inorganic film may include, for example, polyorganosiloxane, but is not limited thereto. The encapsulation layer 190 may be one or two or more layers.

The color conversion panel 200 may convert light of a specific wavelength supplied from the light emitting panel 100 into light of a first or second emission spectrum different from the specific wavelength and emit it toward an observer (not shown) and specifically, may include an upper substrate 210, a light blocking pattern 220, a color filter layer 230, a planarization layer 240, a partition wall 250, a color conversion layer 270, and an encapsulation layer 290.

The upper substrate 210 may be a glass substrate or a polymer substrate. The polymer substrate may include, for example, polyimide, polyamide, polyamide-imide, polyethylene terephthalate, polyethylene naphthalene, polymethyl methacrylate, polycarbonate, a copolymer thereof, or a combination thereof, but is not limited thereto.

The color conversion layer 270 faces the light emitting device 180 of the light emitting panel 100. The color conversion layer 270 may include at least one color conversion region for converting an emission spectrum of light supplied from the light emitting panel 100 into other emission spectrum, and the color conversion region may, for example, convert light in the emission spectrum supplied from the light emitting panel 100 into light in the emission spectrum of the color displayed by each of the subpixels $PX_1$, $PX_2$, and $PX_3$.

The color conversion region may include a color converting body that converts the emission spectrum of light supplied from the light emitting panel 100 into another emission spectrum, and the display panel according to the embodiment may include the quantum dot composite according to the embodiment in the color conversion region.

The color conversion region may convert light from the light emitting panel into light having a spectrum of a color displayed by each of the subpixels $PX_1$, $PX_2$, and $PX_3$ with the subpixels emitting the converted light. Accordingly, the quantum dots included in each color conversion region may be different from the other.

Referring to FIG. 5, at least a portion of the color conversion layer 270 may include the quantum dot composite including quantum dots. For example, the color conversion layer 270 may include a first color conversion region 270a included in the first subpixel $PX_1$ and including first quantum dots 271a, a second color conversion region 270b included in the second subpixel $PX_2$ and including second quantum dots 271b, and a light transmitting region 270c.

The first quantum dots 271a included in the first color conversion region 270a may convert the light emitted from the light emitting panel 100 into light of the first emission spectrum that is the same as the wavelength spectrum of the color displayed in the first subpixel $PX_1$. The first emission spectrum may be different from the emission spectrum of the light emitted from the light emitting panel 100 and may have a longer wavelength than the emission spectrum.

The second quantum dots 271b included in the second color conversion region 270b may convert the light emitted from the light emitting panel 100 into the light of the second wavelength spectrum that is the same as the wavelength spectrum of the color displayed in the second subpixel $PX_2$. The second emission spectrum may be different from the first emission spectrum and may have a longer wavelength than the first emission spectrum.

For example, when the light emitting device 180 of the light emitting panel 100 emits light of a blue emission spectrum, and the first subpixel $PX_1$, the second subpixel $PX_2$, and the third subpixel $PX_3$ respectively displays red, green, and blue, the first quantum dot 271a included in the first color conversion region 270a may convert the light of the blue emission spectrum into light of the red emission spectrum, and the second quantum dot 271b included in the second color conversion region 270b may convert the light of the blue emission spectrum into light of the green emission spectrum. Herein, since the first quantum dot 271a emits light of a longer wavelength spectrum than that of the second quantum dot 271b, the first quantum dot 271a may have a larger size than that of the second quantum dot 271b. The blue displayed in the third subpixel $PX_3$ may be displayed by the light of the blue emission spectrum emitted from the light emitting device 180 of the light emitting panel 100 and thus displayed through the light transmitting region 270c without a separate color conversion body (quantum dot) in the third subpixel $PX_3$. However, the third subpixel $PX_3$ may further include the color conversion body such as a quantum dot emitting light of the blue emission spectrum.

In the first color conversion region 270a, the first quantum dots 271a are dispersed in a matrix 273a. In the second color conversion region 270b, the second quantum dots 271b are dispersed in a matrix 273b. In the light transmitting region 270c, a matrix 273c may be included. Moreover, in order to scatter incident light, light scatterers 272a, 272b and 272c may further be included in the first color conversion region 270a, the second color conversion region 270b and the light transmission region 270c.

The partition wall 250 may define each region of the color conversion layer 270 and be disposed between adjacent regions. For example, the partition wall 250 may respectively define the aforementioned first and second color conversion regions 270a and 270b and light transmitting region 270c and be disposed between the adjacent first and second color conversion regions 270a and 270b, between the second color conversion region 270b and the light transmitting region 270c which are neighboring each other, and/or between the first color conversion region 270a and the light transmitting region 270c, which are neighboring each other. The partition wall 250 may provide a space to which a composition for the color conversion layer 270 is supplied and simultaneously, prevent each composition for the first color conversion region 270a, the second color conversion region 270b, and the light transmitting region 270c from overflowing into each neighboring first color conversion region 270a, second color conversion region 270b, and light transmitting region 270c during the process of forming the first color conversion region 270a, the second color conversion region 270b, and the light transmitting region 270c.

The partition wall 250 may directly contact the first color conversion region 270a, the second color conversion region 270b, and the light transmitting region 270c without separate layers between the partition wall 250 and the first color conversion region 270a, between the partition wall 250 and the second color conversion region 270b, and between the partition wall 250 and the light transmitting region 270c.

The color filter layer 230 may more precisely filter light emitted from the color conversion layer 270 and thus enhance color purity of the light emitted toward the upper substrate 210. For example, the first color filter 230a overlapped with the first color conversion region 270a may block light not converted by but transmitting the first quantum dot 271a of the first color conversion region 270a resulting in enhanced color purity of light of the red emission spectrum. For example, the second color filter 230b overlapped with the second color conversion region 270b may block light not converted by but transmitting the second quantum dot 271b of the second color conversion region 270b resulting in enhanced color purity of light of the green emission spectrum. For example, the third color filter 230c overlapped with the light transmitting region 270c may block light other than light of the blue emission spectrum resulting in enhanced color purity of light of the blue emission spectrum. For example, at least some of the first, second, and third color filter 230a, 230b, and 230c may be omitted, for example, the third color filter 230c overlapped with the light transmitting region 270c may be omitted.

The light blocking pattern 220 may partition each subpixel $PX_1$, $PX_2$, and $PX_3$ and be disposed between the neighboring subpixels $PX_1$, $PX_2$, and $PX_3$. The light blocking pattern 220 may be, for example, a black matrix. The light blocking pattern 220 may be overlapped with the edges of the neighboring color filters 230a, 230b, and 230c.

The planarization layer 240 may be disposed between the color filter layer 230 and the color conversion layer 270 and may reduce or eliminate a step difference caused by the color filter layer 230. The planarization layer 240 may include an organic material, an inorganic material, an organic-inorganic material, or a combination thereof. The planarization layer 240 may include, for example, an oxide, a nitride, or an oxynitride, for example, silicon oxide, silicon nitride, silicon oxynitride, or a combination thereof, but is not limited thereto. The planarization layer 240 may be one layer or two or more layers and may cover the whole surface of the upper substrate 210.

The encapsulation layer 290 may cover the color conversion layer 270 and the partition wall 250, and may include a glass plate, a metal thin film, an organic film, an inorganic film, an organic-inorganic film, or a combination thereof. The organic film may include, for example, an acrylic resin, a (meth)acrylic resin, polyisoprene, a vinyl resin, an epoxy resin, a urethane resin, a cellulose resin, a perylene resin, or a combination thereof, but is not limited thereto. The inorganic film may include, for example, an oxides, a nitride, and/or an oxynitride, for example silicon oxide, silicon nitride, silicon oxynitride, aluminum oxide, aluminum nitride, aluminum oxynitride, zirconium oxide, zirconium nitride, zirconium oxynitride, titanium oxide, titanium nitride, titanium oxynitride, hafnium oxide, hafnium nitride, hafnium oxynitride, tantalum oxide, tantalum nitride, tantalum oxynitride, lithium fluoride, or a combination thereof, but is not limited thereto. The organic-inorganic film may include, for example, polyorganosiloxane, but is not limited thereto. The encapsulation layer 290 may be one or two or more layers.

A light transmitting layer 300 may be disposed between the light emitting panel 100 and the color conversion panel 200. The light transmitting layer 300 may be, for example, a filling material. The light transmitting layer 300 may include an organic material, an inorganic material, an organic-inorganic material, or a combination thereof, and may include, for example, an epoxy resin, a silicone compound, a polyorganosiloxane, or a combination thereof.

Figure 9:
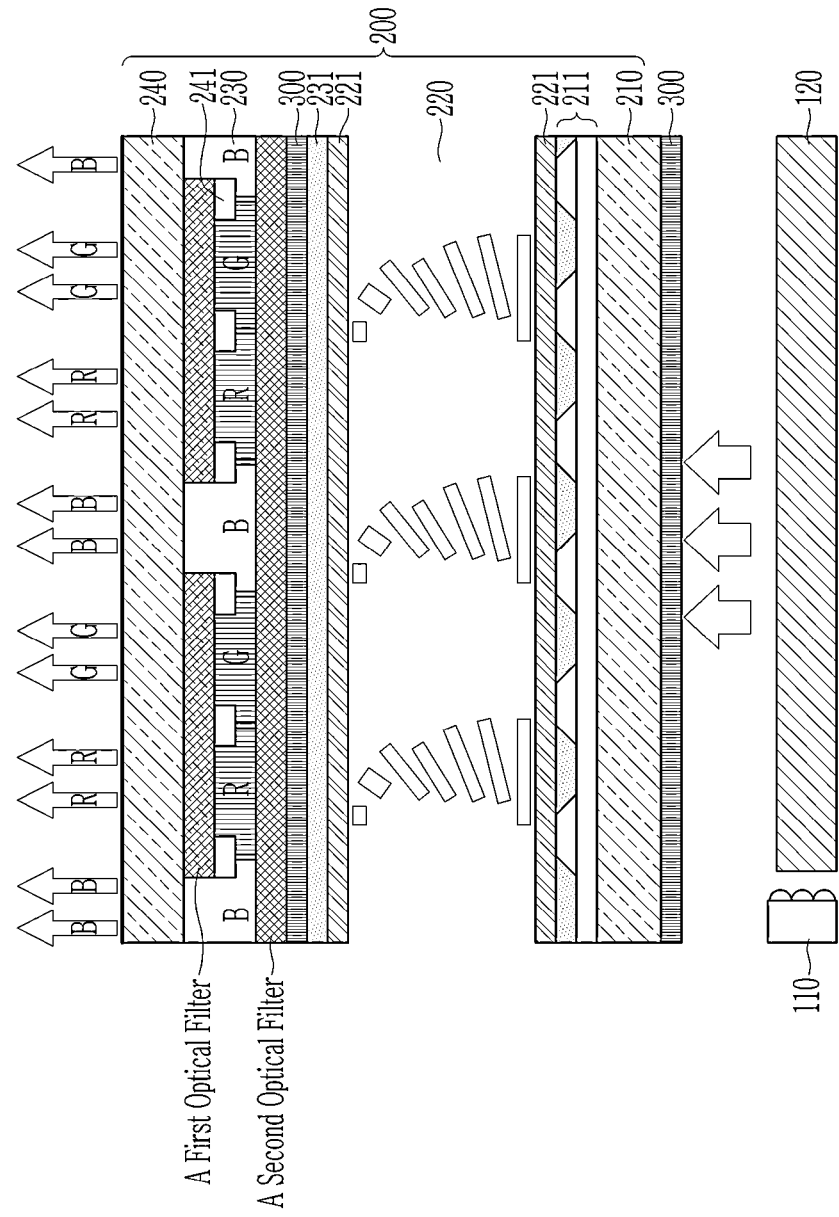
FIG. 9 is a schematic cross-sectional view of a display device according to an embodiment.

Referring to FIG. 9, as a display device according to a non-limiting embodiment, for example, a liquid crystal display device will be described with reference to the drawing. FIG. 9 is a schematic cross-sectional view of a liquid crystal display device according to a non-limiting embodiment.

Referring to FIG. 9, a display device according to an embodiment includes a liquid crystal panel 200, a polarizing plate 300 disposed under the liquid crystal panel 200, and a backlight unit disposed under the polarizing plate 300. The backlight unit includes a light source 110 and a light guide plate 120. The backlight unit may be in a form of direct lighting without a light guide plate.

The liquid crystal panel 200 includes a lower substrate 210, an upper substrate 240, and a liquid crystal layer 220 between the lower substrate 210 and the upper substrate 240, and a color conversion layer 230 disposed on the upper surface or lower surface of the upper substrate 240. The color conversion layer 230 may include a quantum dot polymer composite according to an embodiment.

The lower substrate 210 referred to as an array substrate may be a transparent insulation material substrate. The substrate is the same as described above. A wire plate 211 is provided on an upper surface of the lower substrate 210. The wire plate 211 may include a plurality of gate lines (not shown) and data lines (not shown) that define a pixel area, a thin film transistor disposed adjacent to a crossing region of gate lines and data lines, and a pixel electrode for each pixel area, but is not limited thereto. Details of such a wire plate are known and are not particularly limited.

A liquid crystal layer 220 is provided on the wiring plate 211. The liquid crystal layer 220 may include an alignment layer 221 on and under the liquid crystal layer 220 to initially align the liquid crystal material included therein. Details (e.g., a liquid crystal material, an alignment layer material, a method of forming liquid crystal layer, a thickness of liquid crystal layer, or the like) of the liquid crystal material and the alignment layer are known and are not particularly limited.

A polarizing plate 300 is provided under the lower substrate. Materials and structures of the polarizing plate 300 are known and are not particularly limited. A backlight unit (e.g., emitting blue light) may be disposed under the polarizing plate 300. An upper optical element or the polarizing plate 300 may be provided between the liquid crystal layer 220 and the upper substrate 240, but is not limited thereto. For example, the polarizing plate may be disposed between the liquid crystal layer 220 and the color conversion layer 230. The polarizing plate may be any polarizer that used in a liquid crystal display device. The polarizing plate may be TAC (triacetyl cellulose) having a thickness of less than or equal to about 200 μm, but is not limited thereto. In another embodiment, the upper optical element may be a coating that controls a refractive index without a polarization function.

The light source 110 included in the backlight unit may emit blue light or white light. The light source may include a blue LED, a white LED, a blue OLED, a white OLED, or a combination thereof, but is not limited thereto.

In an embodiment, the backlight unit may be an edge-type lighting. For example, the backlight unit may include a reflector (not shown), a light guide plate (not shown) provided on the reflector and providing a planar light source with the liquid crystal panel 200, and/or at least one optical sheet (not shown) on the light guide plate, for example, a diffusion plate, a prism sheet, and the like, but is not limited thereto. For example, the backlight unit may have a reflector (not shown) and may have a plurality of fluorescent lamps disposed on the reflector at regular intervals, or may have an LED operating substrate on which a plurality of light emitting diodes may be disposed, a diffusion plate thereon, and optionally at least one optical sheet. Details (e.g., each component of a light emitting diode, a fluorescent lamp, a light guide plate, various optical sheets, and a reflector) of such a backlight unit are known and are not particularly limited.

A black matrix 241 is provided under the upper substrate 240 and has openings and hides a gate line, a data line, and a thin film transistor of the wire plate on the lower substrate. For example, the black matrix 241 may have a grid shape. The color conversion layer 230 is provided in the opening of the black matrix 241 and has a quantum dot-polymer composite pattern including a first region R configured to emit first light (e.g., red light), a second region G configured to emit second light (e.g., green light), and a third region B configured to emit/transmit, for example blue light. If needed, the color conversion layer 230 may further include at least one fourth region. The fourth region may include a quantum dot that emits light of different color from light emitted from the first to third regions (e.g., cyan, magenta, and yellow light).

In the color conversion layer 230, regions forming the pattern may be repeated corresponding to pixel areas formed on the lower substrate. A transparent common electrode 231 may be provided on the photoluminescent type color conversion layer 230.

The third region B configured to emit/transmit blue light may be a transparent color filter that does not change the emission spectrum of the light source. In this case, blue light emitted from the backlight unit may enter in a polarized state and may be emitted through the polarizing plate and the liquid crystal layer as it is. If needed, the third region may include a quantum dot emitting blue light.

If desired, the display device or the light emitting device according to an embodiment may further include an excitation light blocking layer or a first optical filter layer (hereinafter, referred to as a first optical filter layer). The first optical filter layer may be disposed between the bottom surfaces of the first region R and the second region G and the substrate (e.g., the upper substrate 240) or on the upper surface of the substrate. The first optical filter layer may be a sheet having an opening in a portion corresponding to a pixel region (third region) displaying blue, and thus may be formed in portions corresponding to the first and second regions. Two or more first optical filter layers may be spaced apart from each other at positions overlapped with the first and second regions, and optionally, the third region. When the light source includes a green light emitting element, a green light blocking layer may be disposed on the third region.

The first optical filter layer may block light having, for example, a predetermined wavelength region in the visible light region and may transmit light in the other wavelength regions, and for example, it may block blue light (or green light) and may transmit light except the blue light (or green light). The first optical filter layer may transmit, for example, green light, red light, and/or yellow light which is a light of mixed color thereof. The first optical filter layer may transmit blue light and block green light, and may be disposed on the blue light emitting pixel.

The display device may further include a second optical filter layer (e.g., recycling layer of red/green light or yellow light) that is disposed between the photoluminescent layer and the liquid crystal layer (e.g., between the photoluminescent layer and the upper polarizer), transmits at least a portion of the third light (excitation light), and reflects at least a portion of the first light and/or the second light. The first light may be red light, the second light may be green light, and the third light may be blue light. The second optical filter layer may transmit only the third light (B) in a blue light wavelength region having a wavelength region of less than or equal to about 500 nm and light in a wavelength region of greater than about 500 nm, which is green light (G), yellow light, red light (R), or the like, may be not passed through the second optical filter layer and reflected. The reflected green light and red light may pass through the first and second regions and to be emitted to the outside of the display device.

The second optical filter layer or the first optical filter layer may be formed as an integrated layer having a relatively planar surface.

The first optical filter layer may include a polymer thin film including a dye and/or a pigment absorbing light in a wavelength which is to be blocked. The second optical filter layer and the first optical filter layer may include a single layer having a low refractive index, and may be, for example, a transparent thin film having a refractive index of less than or equal to about 1.4, less than or equal to about 1.3, or less than or equal to about 1.2. The second optical filter layer or the first optical filter layer having a low refractive index may be, for example, a porous silicon oxide, a porous organic material, a porous organic-inorganic composite, or a combination thereof.

The first optical filter layer or the second optical filter layer may include a plurality of layers having different refractive indexes. It may be formed by stacking two layers having different refractive indexes. For example, the first/second optical filter layer may be formed by alternately stacking a material having a high refractive index and a material having a low refractive index.

Hereinafter, the embodiments are illustrated in more detail with reference to examples. However, they are exemplary examples of the present disclosure, and the present disclosure is not limited thereto.

EXAMPLES

Analysis Methods

[1] UV-Vis Spectroscopy

UV spectroscopy is performed by using an Agilent Cary5000 spectrometer to obtain a UV-Visible absorption spectrum.

[2] Photoluminescence Analysis

A Hitachi F-7000 spectrometer is used to obtain photoluminescence (PL) spectra of the produced quantum dots at excitation wavelength of 450 nm.

[3] ICP Analysis

Shimadzu ICPS-8100 is used to perform inductively coupled plasma-atomic emission spectrometry (ICP-AES).

[4] Thermogravimetric Analysis (TGA) Method

Thermogravimetric analysis (TGA) is an analysis method that measures a weight change of a sample over a predetermined period of time as the sample changes temperature at a determined rate. A mass-temperature curve obtained by TGA provides information on the thermal stability of the sample, a composition ratio of mixing materials, and a thermal composition of an intermediate generated during heating, and also, provides information on a remnant (ash) composition after the heating is completed. Measurements in the present experiment are performed under a nitrogen ($N_2$) atmosphere, while the temperature is increased from room temperature (RT) to about 600° C. at 10° C. per minute.

[5] Method for Measuring Reliability (Luminance) of Quantum Dot-Composite Films

The produced quantum dot composite is coated on a glass substrate to form a film, and a capping layer is formed on the film. The substrate is then fixed on an LED chip, and an appropriate voltage is applied to measure reliability for a desired luminance range.

Synthesis Example 1: Preparation of Green InP Core

InP semiconductor nanocrystal particles (hereinafter, also referred to as a core or cores) are prepared in the following manner.

In a 200 mL reaction flask, indium acetate and palmitic acid are added to 1-octadecene and heated at 120° C. under vacuum. The mole ratio of indium to palmitic acid is about 1:3. After 1 hour, nitrogen is introduced into the reaction flask, the reactor is heated to 280° C., and a mixed solution of tris(trimethylsilyl)phosphine (TMS3P) and trioctylphosphine is rapidly injected into the reaction flask and the contents reacted for 20 minutes. The reaction solution is allowed to cool to room temperature and acetone is added to facilitate a formation of a precipitate. The precipitate is separated with a centrifuge and dispersed in toluene. Herein, TMS3P is used in an amount of 0.5 moles per 1 mole of indium. A size of the obtained InP core is about 2 nm.

Synthesis Example 2: Preparation of Red InP Core

InP semiconductor nanocrystal particles (hereinafter, also referred to as core or cores) are prepared in the following manner.

In a 200 mL reaction flask, indium acetate and palmitic acid are added to 1-octadecene and heated at 120° C. under vacuum. A mole ratio of indium to palmitic acid is about 1:3. After 1 hour nitrogen is introduced into the reaction flask, the reactor heated to 280° C., and a mixed solution of tris(trimethylsilyl)phosphine (TMS3P) and trioctylphosphine is rapidly injected into the flask, and the contents allowed to react for 20 minutes. The reaction solution is allowed to cool to room temperature and acetone is added to facilitate the formation of a precipitate. The precipitate is separated with a centrifuge and dispersed in toluene. Herein, TMS3P is used in an amount of 0.75 moles per 1 mole of indium. A size of the obtained InP core is about 3.6 nm.

Synthesis Example 3: Preparation of Green Quantum Dot (InP/ZnSe/ZnS)

Selenium is dispersed in trioctylphosphine to prepare a Se/TOP stock solution, and sulfur is dispersed in trioctylphosphine to prepare a S/TOP stock solution.

In a 200 mL reaction flask, 24 millimoles (mmols) of zinc acetate and oleic acid are dissolved in trioctylamine and vacuum-treated at 120° C. for 10 minutes. Nitrogen is introduced into the reaction flask, and the toluene dispersion of the InP core synthesized in Synthesis Example 1 is injected as the temperature of the reaction mixture is raised to 320° C. The prepared Se/TOP stock solution is injected over several additions. A reaction ensues to obtain a reaction solution including particles having a ZnSe shell disposed on the InP core. A total reaction time is approximately 100 minutes, and a total content of Se used per 1 mole of indium is about 23 moles.

Thereafter, at a reaction temperature of 320° C., the S/TOP stock solution is injected into the reaction solution. A reaction ensues to obtain a reaction solution including particles in which a ZnS shell is disposed on the ZnSe shell. The total reaction time is 60 minutes, and the total content of S used for 1 mole of indium is about 13 moles. Thereafter, the solution is cooled to room temperature, an excess of ethanol is added to facilitate the formation of a precipitate, and the precipitate separated with a centrifuge. The precipitate is dried and dispersed in cyclohexyl acetate to obtain an InP/ZnSe/ZnS quantum dot solution.

Synthesis Example 4: Preparation of Red Quantum Dot (InP/ZnSe/ZnS)

Core/shell quantum dots are prepared in a manner similar to Synthesis Example 3 except that the red light InP cores of Synthesis Example 2 are used instead of the InP cores of Synthesis Example 1. Selenium is dispersed in trioctylphosphine to prepare Se/TOP stock solution, and sulfur is dispersed in trioctylphosphine to prepare an S/TOP stock solution.

In a reaction flask, 7.2 mmols of zinc acetate and oleic acid are added to a reaction flask with trioctylamine, and the reaction mixture is vacuum-treated at 120° C. for 30 minutes. Nitrogen is then introduced into the flask and the temperatures increased to 280° C. for 10 minutes to obtain a reaction medium including a zinc precursor.

The temperature of the prepared zinc precursor—is lowered to 180° C., and the cores of Synthesis Example 2 are injected into the flask. The reaction system is heated to 320° C., Se/TOP and a solution of additional zinc precursors are injected into the reaction flask, and the mixture reacted for about 30 minutes. Subsequently, the S/TOP stock solution and the zinc precursors are injected to the reaction solution, the mixture is allowed to react for about 60 minutes, and then, the reaction solution is rapidly lowered to room temperature.

An excess of ethanol is added to facilitate the formation of a precipitate that is then separated with centrifuge. The precipitate is dried and dispersed in cyclohexyl acetate to obtain an InP/ZnSe/ZnS quantum dot solution. The total content of Se per 1 mole of indium is about 12 moles, and the total content of S used per 1 mole of indium is about 5 moles.

Synthesis Example 5: Preparation of Dispersion for Surface-Modifying Quantum Dot (1) Preparation of Compound of Chemical Formula A 50 g of thioglycolic acid, 91 g of 2-[2-(2-methoxyethoxy)ethoxy]-ethanol, and 10.27 g of p-toluene sulfonic acid monohydrate are added to a flask with 500 mL of cyclohexane under a nitrogen atmosphere. A dean stark apparatus with a condenser is connected to the inlet of the flask. After heating the reaction flask to 80° C. and stirring for a certain time, it is confirmed that water collects inside the dean stark reservoir. Once the presence of the water is confirmed, the reaction solution is stirred for an additional 12 hours thereafter. After confirming that 0.54 mole of water is produced, the reaction is terminated. Ethyl acetate and an excess of water are added to the solution, and after extraction and neutralization, the mixture is concentrated with a vacuum evaporator. The compound represented by Chemical Formula A is dried in a vacuum oven as a final product.

Chemical Formula A

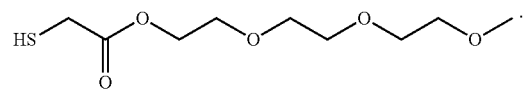

(2) Preparation of Compound of Chemical Formula E 100 g of pentaethylene glycol monomethyl ether, 14.3 g of NaOH, 500 mL of THF, and 100 mL of $H_2O$ are mixed to prepare a solution. 79 g of p-toluene sulfonic chloride and 150 mL of THF are slowly injected into the solution at 0° C. over about 30 minutes. The mixture is continuously stirred at room temperature for about 12 hours. The product mixture is purified through extraction, neutralization, and concentration under vacuum and then, sufficiently dried in a vacuum oven. The obtained product is placed in a flask and dissolved in ethanol under a nitrogen atmosphere. After adding 3 to 5 equivalents of thiourea to the flask, the mixture is stirred at 100° C. for 12 hours. Subsequently, about 20 equivalents of a diluted NaOH solution is injected into the reactant mixture and the mixture is stirred for 5 hours. The resulting product is washed several times with water and a dilute hydrochloric acid solution, extracted, neutralized, and concentrated under vacuum. The resulting product is sufficiently dried in a vacuum oven, obtaining a compound represented by Chemical Formula E:

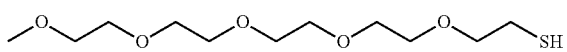

Chemical Formula E

Example 1 and Comparative Example 1: Preparation of Surface-Modified Green Quantum Dots To a three-necked round-bottom flask is added a cyclohexyl acetate solution of the green quantum dots (InP/ZnSe/ZnS) (a content of about 26 wt % to 27 wt %) in accordance with Synthesis Example 3. The compound represented by Chemical Formula A in accordance with (1) of Synthesis Example 5, is then added to the flask. The reaction mixture is mixed for 1 minute and stirred at 80° C. under a nitrogen atmosphere. The stirring time may be varied to control the degree of ligand substitution (exchange) of the compound of Chemical Formula A for the oleic acid on the surface of the quantum dots of Synthesis Example 3.

The quantum dots of Example 1 are obtained by allowing the reaction solution to cool to room temperature before the ligand substitution (exchange) reaction is complete, that is, when the compound represented by Chemical Formula A is substituted for a portion of the oleic acid bound to the surface of the quantum dots. The cooled reaction solution is added to cyclohexane to facilitate precipitation of the ligand exchanged (surface-modified) quantum dots. The precipitated quantum dots are separated by centrifugation and sufficiently dried in a vacuum oven for one day. The obtained surface-modified quantum dots include both oleic acid and the compound of Chemical Formula A bound to the surface. The surface-modified quantum dots are added to a monomer represented by Chemical Formula 15-1 (triethylene glycol dimethacrylate, Miwon Commercial Co., Ltd), and stirred for about 12 hours, obtaining a surface-modified green quantum dots dispersion according to Example 1:

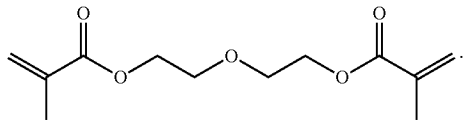

Chemical Formula 15-1

In contrast, for the quantum dots of Comparative Example 1, unlike the quantum dots of Example 1, significantly longer mixing times is used in conducting the exchange reaction so that most, if not near all, of the oleic acid on the surface is exchanged for the compound represented by Chemical Formula A. In other words, after sufficient stirring times, and then, cooling the reaction solution to room temperature, most of oleic acid ligand on the surface the quantum dots are substituted (exchanged) with the compound of Chemical Formula A. The surface-modified quantum dots are separated and washed, and then, added to the monomer represented by Chemical Formula 15-1 in the same manner as Example 1. Accordingly, green quantum dot dispersion according to Comparative Example 1 in which the surface of the quantum dots are almost entirely substituted with the compound of Chemical Formula A is obtained.

Example 2 and Comparative Example 2: Preparation of Surface-Modified Green Quantum Dots The compound of Chemical Formula E prepared in accordance with (2) of Synthesis Example 5 is used instead of the (1) of Synthesis Example 5 as a compound for the surface modification in the same manner as in Example 1 and Comparative Example 1. Accordingly, a green quantum dot dispersion according to Example 2 is obtained in which the surface-modified quantum dots partially include the compound represented by Chemical Formula E along with oleic acid bound to the surface. As for the green quantum dot dispersion according to Comparative Example 2 include quantum dots that are entirely, or near entirely, substituted with the compound of Chemical Formula E bound to the surface.

Example 3 and Comparative Example 3: Preparation of Surface-Modified Red Quantum Dots The red quantum dots of Synthesis Example 4 are used instead of the quantum dots of Synthesis Example 3 in the same manner as Example 1 and Comparative Example 1. Accordingly, the red quantum dot dispersion of Example 3 includes red quantum dots in which the surface partially includes the compound of Chemical Formula A along with the oleic acid. As for the red quantum dot dispersion of Comparative Example 3, the surface of the red quantum dots is entirely, or near entirely, substituted with the compound of Chemical Formula A.

Example 4 and Comparative Example 4: Preparation of Surface-Modified Red Quantum Dots The red quantum dots of Synthesis Example 4 are used instead of the quantum dots of Synthesis Example 3 in the same manner as Example 2 and Comparative Example 2. Accordingly, the red quantum dot dispersion of Example 4 includes red quantum dots in which the surface partially includes the compound of Chemical Formula E along with the oleic acid bound to the surface. As for the red quantum dot dispersion of Comparative Example 4, the surface of the red quantum dots is entirely, or near entirely, substituted with the compound represented by Chemical Formula E.

Example 5 and Comparative Example 5: Preparation of Surface-Modified Green Quantum Dot Ink Composition Each quantum dot dispersion according to Example 1 and Comparative Example 1 is weighed and mixed in a flask and diluted with a monomer represented by Chemical Formula 15-1, and a polymerization inhibitor (methylhydroquinone, Tokyo Chemical Industry Co., Ltd.; 5 wt % in a monomer represented by Chemical Formula 15-1) is added to the flask. The mixture is, stirred for 5 minutes. After which a photoinitiator (TPO-L, Polynetron), and a light diffusing agent ($TiO_2$; SDT89, Iridos) is added to the flask, and the dispersion is stirred for 1 hour, to obtain solvent-free quantum dot ink compositions according to Example 5 and Comparative Example 5. Based on a total amount of the solvent-free curable composition, the quantum dots are 48 wt %, the monomer represented by Chemical Formula 15-1 is 40 wt %, the polymerization inhibitor is 1 wt %, the photoinitiator is 3 wt %, and the light diffusing agent is 8 wt %.

Example 6 and Comparative Example 6: Preparation of Surface-Modified Green Quantum Dot Ink Composition Surface-modified green quantum dot ink compositions according to Example 6 and Comparative Example 6 are prepared in the same manner as in Example 5 and Comparative Example 5 except that the quantum dot dispersions of Example 2 and Comparative Example 2 are respectively used.

Example 7 and Comparative Example 7: Preparation of Surface-Modified Red Quantum Dot Ink Composition Surface-modified red quantum dot ink compositions according to Example 7 and Comparative Example 7 are prepared in the same manner as in Example 5 and Comparative Example 5 except that the quantum dot dispersions of Example 3 and Comparative Example 3 are respectively used.

Example 8 and Comparative Example 8: Preparation of Red Quantum Dot Ink Composition Surface-modified red quantum dot ink compositions according to Example 8 and Comparative Example 8 are prepared in the same manner as in Example 5 and Comparative Example 5 except that the quantum dot dispersions of Example 4 and Comparative Example 4 are respectively used.

Comparative Example 9 and Comparative Example 10: Production of Photoresist Films of Quantum Dot Composite Including Unmodified Green and Red Quantum Dots (1) Preparation of Quantum Dot-Binder Dispersion To each cyclohexyl acetate dispersion of the non-surface modified green quantum dots according to Synthesis Example 3, and the non-surface modified red quantum dots according to Synthesis Example 4, a binder solution (a solution prepared by dispersing a quaternary copolymer of methacrylic acid, benzyl methacrylate, hydroxyethyl methacrylate, and styrene (acid value: 130 mg KOH/g, molecular weight: 8,000 g/mol) in PGMEA (propylene glycol monomethyl ether acetate) is added at a concentration of 30 wt %), preparing each green and red quantum dot-binder dispersion.

(2) Preparation of Photosensitive Composition

To each of the green and red quantum dot binder dispersions is mixed with hexaacrylate having the following structure as a photopolymerizable monomer, glycoldi-3-mercaptopropionate (hereinafter, 2T), an oxime ester compound as an initiator, and $TiO_2$ as a light diffusing agent, and a solvent, PGMEA to prepare each photosensitive resin composition including the quantum dot-binder.

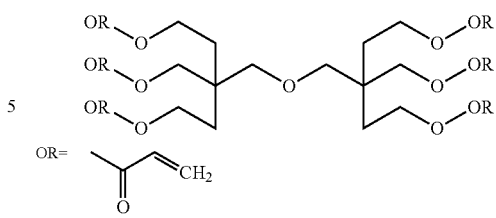

The prepared photosensitive resin composition includes 40 wt % of the quantum dots, 12.5 wt % of the binder polymer, 25 wt % of 2T, 12 wt % of the photopolymerizable monomer, 0.5 wt % of the initiator, and 10 wt % of light diffusing agent based on a total solid content (TSC) of each composition, and the total solid content (TSC) is 25 wt %.

(3) Production of Quantum Dot-Polymer Composite Pattern and Heat Treatment

Each photosensitive composition is spin-coated on a glass substrate at 150 rpm for 5 seconds to obtain films. The films are prebaked (PRB) at 100° C. These prebaked films are exposed to light irradiation (a wavelength: 365 nm, intensity: 100 mJ) for 1 second under a mask having a predetermined pattern (e.g., a square dot or a stripe pattern), developed in a potassium hydroxide aqueous solution (a concentration: 0.043%) for 50 seconds to obtain quantum dot-polymer composite patterns (a thickness: 10 micrometers (µm)). The produced patterns are subjected to FOB (post-bake) treatment in a nitrogen atmosphere at 180° C. for 30 minutes to obtain photoresist films of the green and red quantum dots-polymer composites according to Comparative Examples 9 and 10.

Evaluation 1: Thermogravimetric Analysis of Quantum Dots

The surface-modified green and red quantum dot dispersions according to Example 1 and Comparative Example 1, and Example 3 and Comparative Example 3, are each respectively centrifuged, obtaining precipitated surface-modified quantum dots. The surface-modified quantum dots are respectively washed with hexane, centrifuged again, and dried, obtaining surface-modified quantum dot powders. The surface-modified quantum dots including two types of ligands (exchange ligand and oleic acid) or just the exchange ligand on the surface according to Example 1, Comparative Example 1, Example 3, and Comparative Example 3, are thermogravimetrically analyzed by using a differential scanning calorimeter, and the results are respectively shown in FIGS. 10 and 11. In addition, the quantum dots according to Synthesis Examples 3 and 4 are used as reference examples (i.e., non-surface modified quantum dot dispersions), that is, the green quantum dots and the red quantum dots having an oleic acid ligand are also thermogravimetrically analyzed in the same method as above and the results are shown in FIG. 12.

Figure 10:
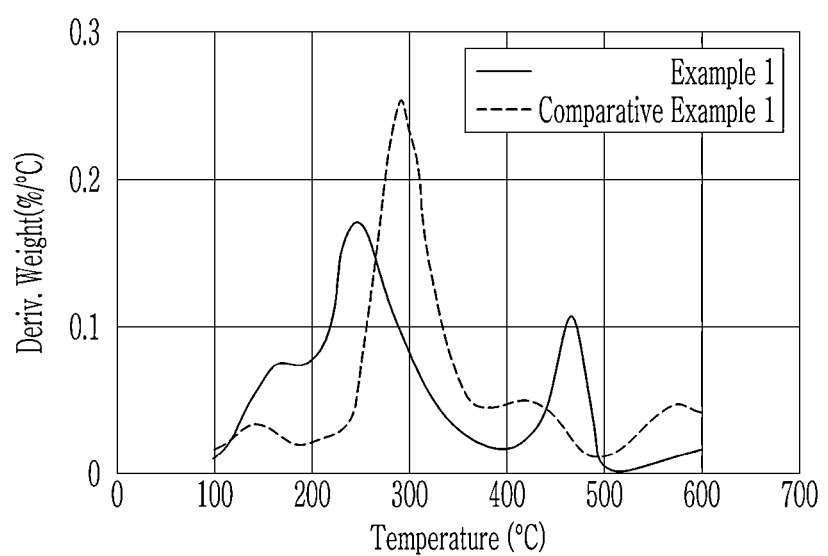
FIG. 10 is a thermogravimetric analysis graph of each of the surface-modified green quantum dots which are prepared in Example 1 and Comparative Example 1 measured using a differential scanning calorimeter.
Figure 11:
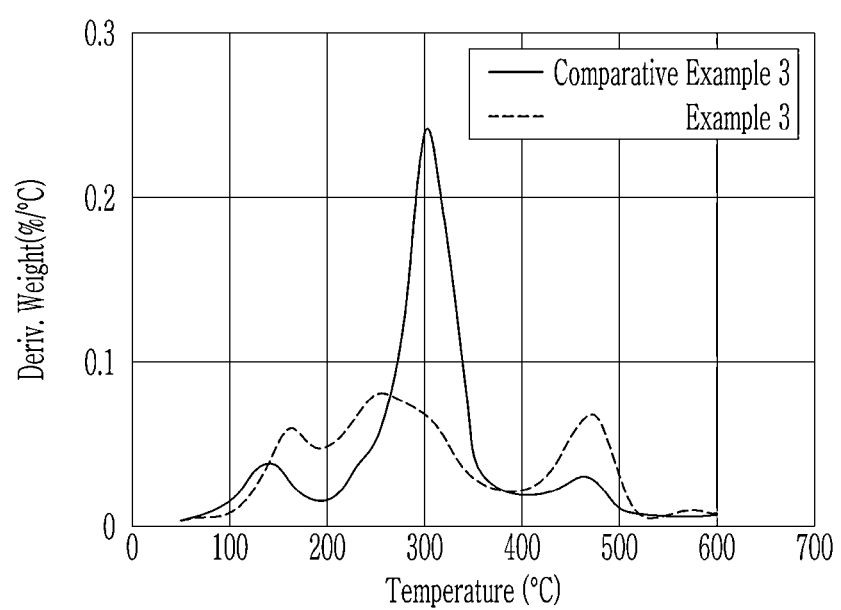
FIG. 11 is a thermogravimetric analysis graph of each of the surface-modified red quantum dots which are prepared in Example 3 and Comparative Example 3 measured using a differential scanning calorimeter.
Figure 12:
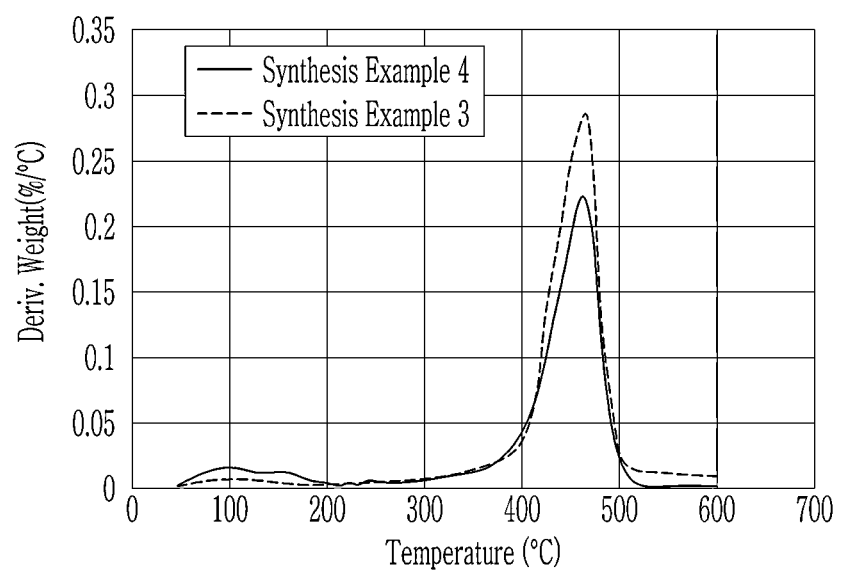
FIG. 12 is a thermogravimetric analysis graph of each of the red and green quantum dots containing oleic acid on the surface and not further surface-modified, which are prepared in Synthesis Example 3 and Synthesis Example 4 measured using a differential scanning calorimeter, respectively.

FIG. 10 shows the thermogravimetric analysis results of the surface-modified green quantum dots according to Example 1 and Comparative Example 1, and FIG. 11 shows the thermogravimetric analysis results of the surface-modified red quantum dots according to Example 3 and Comparative Example 3. In addition, as shown in FIGS. 10 and 11, each area of a peak between about 200° C. and about 300° C. (hereinafter, referred to as 'peak A') and a peak between 400° C. to 500° C. (hereinafter, referred to as 'peak B') is measured, and these results along with a ratio of the area of the peak B relative to the area of the peak A are respectively shown in Table 1.

TABLE 1

|  | Peak A area$^a$ | Peak B area$^a$ | Peak B area/ Peak A area |
|---|---|---|---|
| Example 1 | 192.93 | 58.91 | 0.305 |
| Comp. Example 1 | 237.52 | 39.8 | 0.167 |
| Example 3 | 127.7 | 54.46 | 0.426 |
| Comp. Example 3 | 204.8 | 27.27 | 0.133 |

Peak areas are listed as arbitrary units and determined using software known to a person of skill and provided by the equipment manufacturer.

As shown from Table 1, the quantum dots of Examples 1 and 3 including 2 types of ligands on the surface each exhibit an area ratio of the peak B area to the peak A area, i.e., Peak B area:Peak A area of about 0.17:1, or 0.17:1 or greater. In contrast, the quantum dots of Comparative Examples 1 and 3 in which a conventional oleic acid ligand that is primarily substituted with the compound of Chemical Formula A through surface modification exhibit an area ratio of the Peak B area:Peak A area of less than about 0.17:1, or 0.17:1 as indicated from the results of FIGS. 10 and 11.

In addition, referring to FIGS. 10 and 11, in the quantum dots of Examples 1 and 3, the area of the peak between about 200° C. and about 400° C. is greater than or equal to 40% of the entire peak area in each thermogravimetric analysis graph. In other words, on the surface of the corresponding quantum dots, a compound decomposed at 200° C. to 400° C. is at least greater than or equal to 40% based on an entire weight of the compound.

In contrast, non-surface-modified quantum dots according to Synthesis Examples 3 and 4 as reference examples, as shown from FIG. 12, each exhibit one large peak near about 450° C., and essentially no other peaks are observed. The reason is because the quantum dots of Synthesis Examples 3 and 4 are not all surface-modified, that is, Synthesis Examples 3 and 4 include only one type of ligand, i.e., oleic acid that is added during the preparation of the quantum dots. Accordingly, the one peak at about 450° C. shown in FIG. 12, is believed to correspond to the decomposition of the oleic acid. Likewise, referring back to FIGS. 10 and 11, the relative smaller peaks that appear between 400° C. to 500° C., specifically, at about 465° C., likely corresponds to the decomposition of the oleic acid compound on the surface of the quantum dots. The relatively larger peaks between 200° C. to 300° C., that is, the peak A is likely to correspond to the decomposition of the compound represented by Chemical Formula A that is attached on the surface of the quantum dots, as the quantum dots are surface-modified with the ligand compound represented by Chemical Formula A, that is, a compound having a thiol group. Accordingly, in FIGS. 10 and 11, the quantum dots according to Examples 1 and 3, respectively, undergo a substitution reaction with the compound represented by Chemical Formula A for shorter periods of time, compared with the quantum dots according to Comparative Examples 1 and 3, and therefore, Examples 1 and 3 include relatively larger amounts of oleic acid on the surface than the quantum dots.

Evaluation 2: Production of Single Film from Quantum Dot Ink Compositions and Analysis Each ink composition respectively including the surface-modified green quantum dots according to Example 5 and Comparative Example 5 and the red quantum dots according to Example 7 and Comparative Example 7 is spin-coated to a thickness of about 10 micrometers (μm) on a glass substrate G-1 and G-2, respectively, by using a spin coater (800 rpm, 5 seconds, Opticoat MS-A150, Mikasa Co., Ltd.) and exposed with 5000 millijoules (mJ) under a nitrogen atmosphere by using a 395 nm UV exposer, obtaining each quantum dot composite single film.

Figure 13:
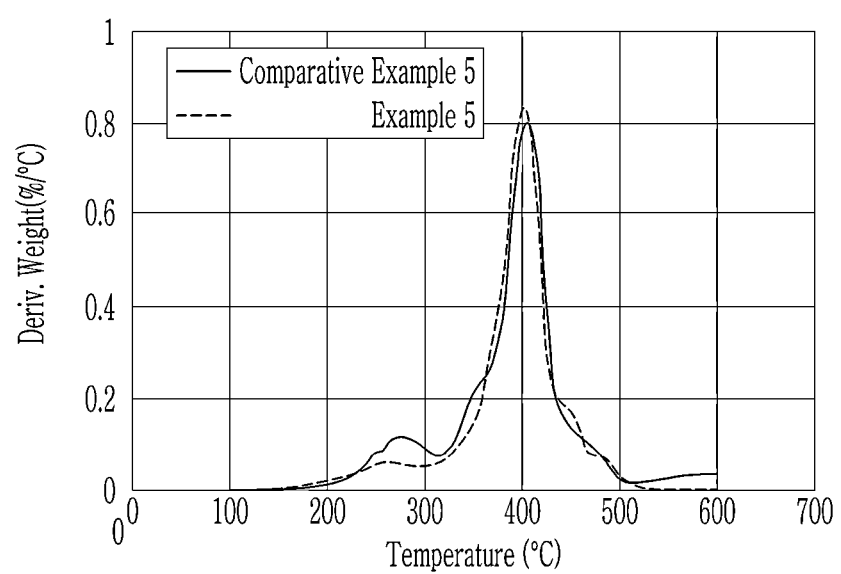
FIG. 13 is a graph of thermogravimetric analysis graph of each of the single films produced from the ink compositions including the surface-modified green quantum dots which are prepared in Example 5 and Comparative Example 5 measured using a differential scanning calorimeter.

The green quantum dot composite single films of Example 5 and Comparative Example 5 among the obtained quantum dot composite single films are thermogravimetrically analyzed in the above method, and the TGA results are shown in FIG. 13. As indicated, a peak at about 400° C. (hereinafter, referred to as "peak D") and a peak between about 200° C. and about 300° C. (hereinafter, referred to as "peak E") are measured with respect to a peak intensity, and the results along with an intensity ratio of the intensity of peak D relative to the intensity of peak E are provided in Table 2.

TABLE 2

|  | Peak E intensity | Peak D intensity | Peak D intensity:Peak E intensity |
|---|---|---|---|
| Example 5 | 53.77 | 546.89 | 10.17:1 |
| Comparative Example 5 | 79.45 | 532.11 | 6.69:1 |

As seen from FIG. 13 and Table 2, the quantum dot composite single film formed of the quantum dot ink composition according to Example 5 exhibits a greater intensity ratio of an intensity of peak D at about 400° C. to an intensity of peak E between about 200° C. and about 300° C. than Comparative Example 5. In particular, the intensity ratio of Example 5 is greater than or equal to 8:1, or greater than or equal to 10:1. In contrast, a quantum dot composite single film formed of the quantum dot ink composition according to Comparative Example 5 exhibits a corresponding intensity ratio of less than 8:1, specifically, less than 7:1. In other words, the quantum dots in the quantum dot ink composition according to Example 5 include two types of compounds on the surface. The oleic acid is decomposed at a similar temperature to that of a photopolymerizable monomer for preparing the quantum dot composite, that is, at about 400° C., and thus, exhibits a peak at about 400° C. with a relatively high height (intensity), and the additionally substituted compound represented by Chemical Formula A is included in relatively smaller amounts than in Comparative Example 5, and thus, exhibits a lower peak intensity between about 200° C. and about 300° C. (peak E) than in Comparative Example 5. Accordingly, the quantum dot composite according to Example 5 exhibits relatively stronger intensity of the peak D to that of the peak E, for example, to provide an intensity ratio of at least greater than or equal to 8:1, i.e., times stronger intensity. On the contrary, the quantum dot composite according to Comparative Example 5 exhibits an intensity ratio of less than 8:1, i.e., 8 times lower intensity of the peak D than that of the peak E.

On the other hand, a content difference of elements in the single film may be determined by ICP emission spectroscopy. For example, the elemental composition of quantum dot composite single films formed of the quantum dot ink compositions according to Example 5 and Comparative Example 5, and Example 7 and Comparative Example 7 can be determined by ICP emission spectroscopy. As indicated, each quantum dot composite exhibits a different mole ratio of zinc to a total sum of moles of sulfur and selenium (Zn:(S+Se)), and the results are shown in Table 3.

TABLE 3

|  | S | Se | Zn | Zn:(S + Se) |
|---|---|---|---|---|
| Example 5 | 15.3 | 4.3 | 22.1 | 1.13:1 |
| Comparative Example 5 | 17.5 | 23.4 | 45.3 | 1.11:1 |
| Example 7 | 5.2 | 6.1 | 11.8 | 1.03:1 |
| Comparative Example 7 | 6.7 | 6.3 | 12.4 | 0.95:1 |

Figure 14:
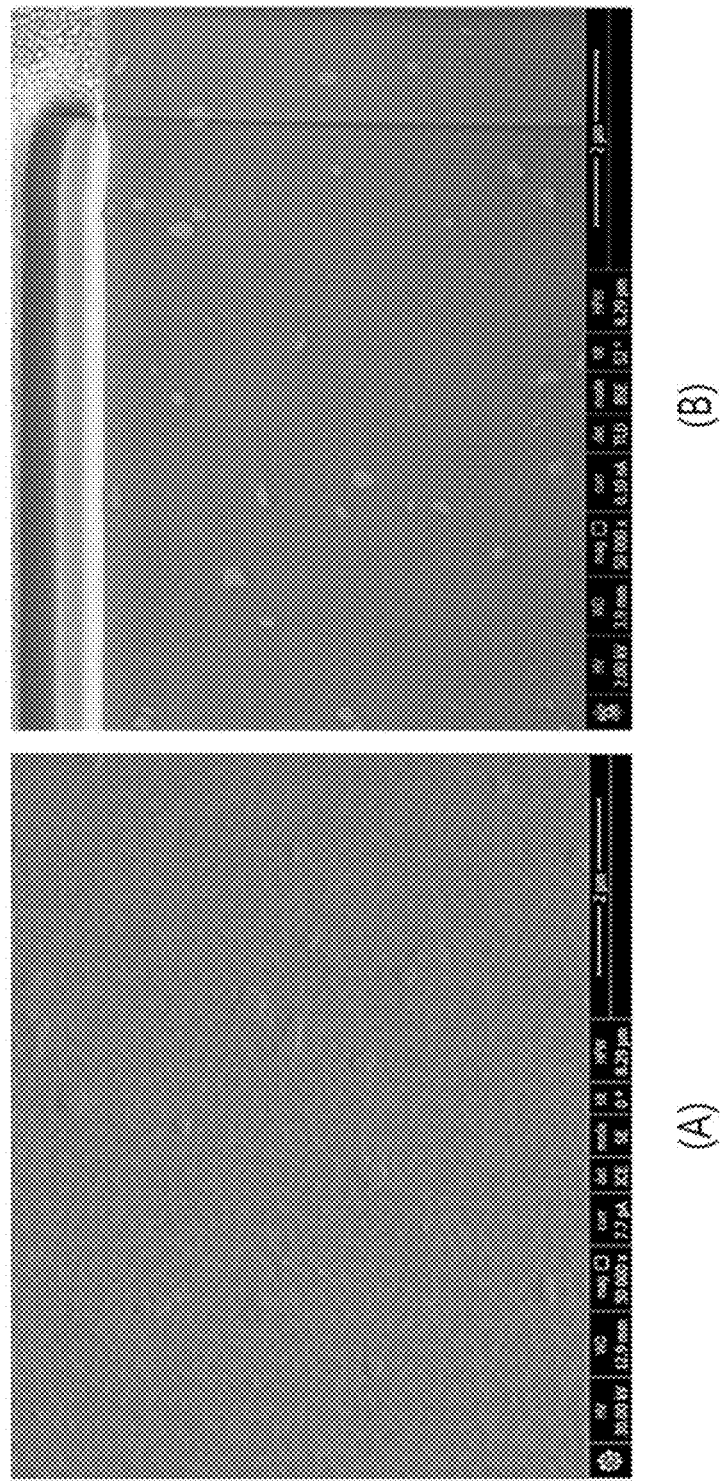
FIG. 14 is a scanning electron microscope (SEM) photograph of each of the single films produced from the ink composition including the surface-modified green quantum dots which are prepared in Example 5 and Comparative Example 5.

In addition, the quantum dot composite single films also exhibit different surface shapes. FIG. 14 shows SEM (Scanning Electron Microscopy) photographs of the single films formed of the quantum dot ink compositions according to Example 5 and Comparative Example 5, and as indicated in FIG. 14(A), the single film formed of the composition of Comparative Example 5 has a rough surface due to particle aggregation. In contrast, as Indicated in FIG. 14(B), the single film formed of the composition of Example 5 has a smooth surface due to no layer separation or particle aggregation.

Evaluation 3: Driving Reliability Experiment

The same method as shown in Evaluation 2 is adopted to evaluate driving or operational reliability of the single films formed of the surface-modified green quantum dot ink compositions of Example 5 and Comparative Example 5 as well as the surface-modified red quantum dot ink compositions of Example 7 and Comparative Example 7. One may also evaluate driving or operational reliability of photoresist single films of quantum dot-polymer composites by using an amphoteric solvent without additional surface modification of the quantum dots according to Comparative Examples 9 and 10.

Figure 15:
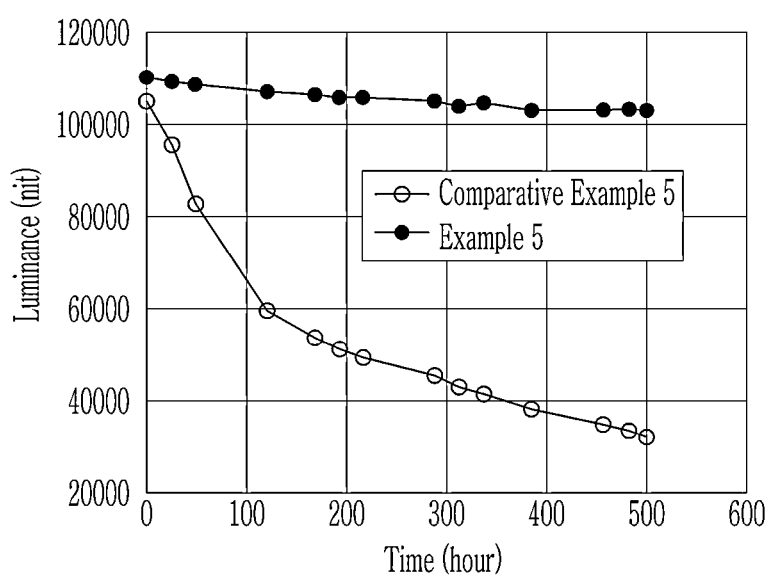
FIG. 15 is a graph showing changes in luminance with respect to time (hours) of single films when driven with an irradiating excitation light source having an initial luminance of about 100,000 nits, the single films produced from the ink compositions including the surface-modified green quantum dots which are prepared in Example 5 and Comparative Example 5.
Figure 16:
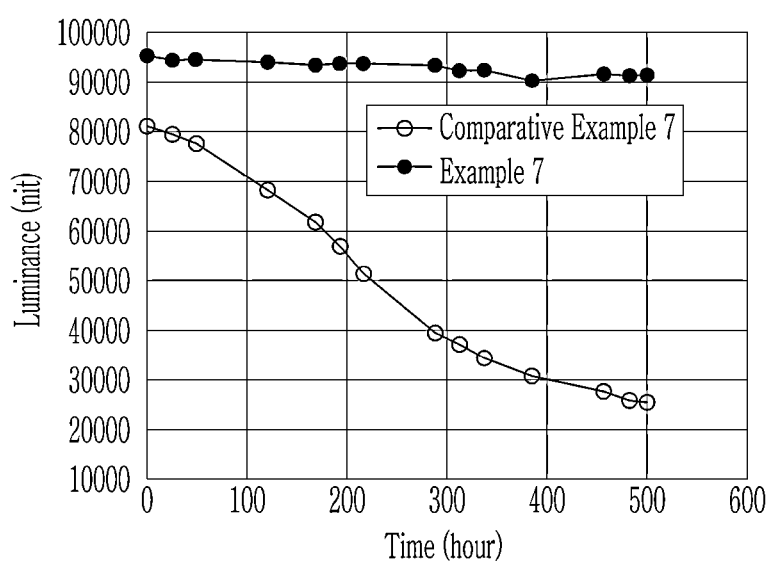
FIG. 16 is a graph showing changes in luminance with respect to time (hours) of single films when driven with an irradiating excitation light source having an initial luminance of about 100,000 nits, the single films produced from the ink compositions including the surface-modified red quantum dots prepared in Example 7 and Comparative Example 7.

Specifically, the films formed from the compositions of Example 5 and Comparative Example 5, and Example 7 and Comparative Example 7, are measured with respect to luminance by driving for 500 hours, while irradiated by excitation light with a light source (wavelength: 450 nm) having a luminance of about 80,000 nits to 100,000 nits at 60° C. in an air condition (atmosphere), and the results are respectively shown in FIGS. 15 and 16. FIG. 15 is a graph showing the luminance results of the films of Example 5 and Comparative Example 5, and FIG. 16 is a graph showing the luminance results of the films of Example 7 and Comparative Example 7.

Figure 17:
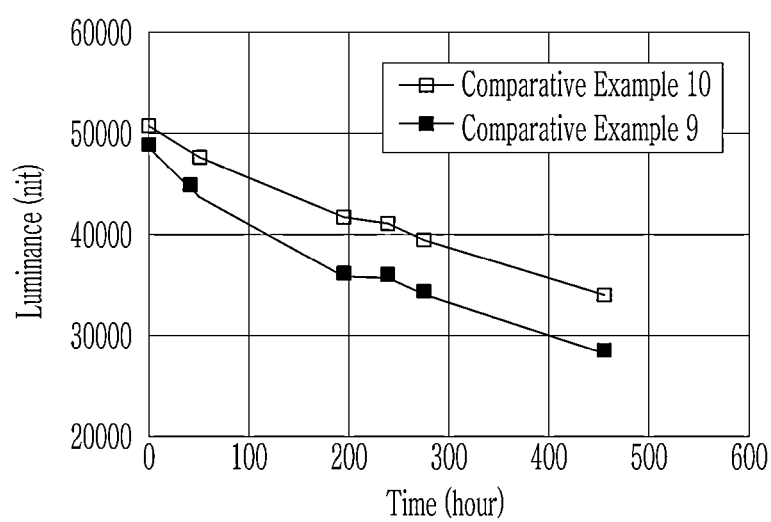
FIG. 17 is a graph showing changes in luminance with respect to time (hours) of single films when driven with an irradiating excitation light source having an initial luminance of about 50,000 nits, the single films produced from the ink compositions including the non-surface-modified green quantum dots and red quantum dots prepared in Comparative Examples 9 and 10, respectively.

The films according to Comparative Examples 9 and 10 also are measured with respect to luminance by driving for 300 hours, while irradiated by excitation light with a light source (wavelength: 450 nm) having luminance about 50,000 nits at 60° C. under the air condition, and the results are shown in FIG. 17.

As shown from FIG. 15, the green light emitting single film of Example 5 including quantum dots satisfying a specific peak area ratio within a specific temperature range according to an embodiment is driven for as long as 500 hours under a high-luminance light source having initial luminance of more than 100,000 nits, and the luminance is shown to slightly decrease by less than 10%. In other words, the single film of Example 5 may be driven with little luminance reduction for a long time (at least 500 hours) under a high-luminance light source. Accordingly, the green light emitting single film of Example 5 may be applied as a micro LED or a mini LED, with a high-luminance light source of 100,000 nits or more.

In contrast, when the single film of Comparative Example 5 (near complete ligand exchange or little or no oleic acid), which is prepared by surface-modifying the same quantum dots as Synthesis Example 3 with the same compound represented by Chemical Formula A but unlike Example 5, has an area ratio of a peak at 400° C. to 500° C. to a peak at about 200° C. and about 300° C. of less than 0.17 times as shown in FIG. 10 is driven under the same high-luminance light source, the initial luminance is reduced by 40% or more in less than 100 hours and reduced by 70% or more when driven for 500 hours. Accordingly, unlike the single film of Example 5, the single film of Comparative Example 5 may not be applied to a device that includes a high-luminance light source due to the significant difference in luminance performance over time.

FIG. 16 shows similar results to FIG. 15. In FIG. 16, when the single film of Example 7, which has an area ratio of a peak at 400° C. to 500° C. to a peak at about 200° C. and about 300° C. of 0.17 times or more as indicated in the TGA graph of FIG. 11, is driven for 500 hours under a light source (450 nm) of about 100,000 nits, the reduction of luminance is within about 5% of the initial luminescence, and accordingly, the film may be driven under the high-luminance light source for an extended time, and may be applied as a micro LED or a mini LED with a high-luminance light source of 100,000 nits or more.

In contrast, the single film of Comparative Example 7, in which the same red quantum dots is excessively or near completely substituted with the material (ligand) of Chemical Formula A, and the area ratio of a peak at 400° C. to 500° C. to a peak at about 200° C. and about 300° C. is shown to be less than 0.17 times in FIG. 11, and as shown in FIG. 16, exhibits luminance reduced by about 50% from the initial luminance of 80,000 nits within 300 hours, and when driven for 500 hours (an additional 200 hours) the luminance is further reduced by about 30% to about 25,000 nits FIG. 17 is a driving reliability graph of the quantum dot-photoresist single films formed by using the quantum dots of Synthesis Examples 3 and 4, that is, the quantum dots including an oleic acid ligand but with no surface modification and the amphoteric solvent in the method described in Comparative Examples 9 and 10. A light source of about 50,000 nits is used to irradiate the quantum dots and the green quantum dot single film of Comparative Example 9 exhibits luminance that is reduced by 30% from the initial luminance when driven for about 300 hours. In addition, the red quantum dot single film of Comparative Example 10 exhibits luminance reduced by 25% from the initial luminance when driven about 300 hours.

In other words, quantum dot composite single films (e.g., a single film of Comparative Example 9 or 10) including green or red quantum dots including only an oleic acid ligand, which are commonly used in the conventional wet manufacturing method, or quantum dot composite single films including quantum dots fully or partially substituted with the oleic acid ligand with other ligands (e.g., a ligand having a thiol group and the like) (e.g., a single film of Comparative Example 5 or 7) exhibit relatively poor driving reliability with a high-luminance light source in comparison with single films of an embodiment(s) described herein. As shown, quantum dot-composite single films, which are prepared using surface-modifying quantum dots with a specific ligand to adjust an area ratio of peaks appearing at a specific temperature depending on a type and content of ligands in a TGA graph measured by DSC into a specific range, exhibit high reliability, when driven for a long time under a high-luminance light source.

Accordingly, the quantum dot and the quantum dot composite including the same according to embodiments are suitably applicable to various light sources, particularly, electronic apparatus including light sources requiring high luminance, for example, display devices such as Augmented Reality (AR) and Virtual Reality (VR) that may typically require high brightness, e.g., display devices such as watches and televisions.

While this disclosure has been described in connection with what is presently considered to be practical embodiments, it is to be understood that the invention is not limited to the disclosed embodiments. On the contrary, it is intended to cover various modifications and equivalent arrangements included within the spirit and scope of the appended claims.

What is claimed is:

1. A quantum dot comprising
a semiconductor nanocrystal core comprising indium and phosphorus,
the quantum dot having an emission peak wavelength from about 600 nm to about 650 nm, or an emission peak wavelength from about 500 nm to about 550 nm,
wherein the quantum dot exhibits an area of a peak from about 400° C. to about 500° C. that is about 0.17 times to about 0.5 times relative to an area of a peak from about 200° C. to about 300° C. in a thermogravimetric analysis graph as determined with a differential scanning calorimeter.

2. The quantum dot of claim 1, wherein in the thermogravimetric analysis graph of the quantum dots, an area of a peak from about 200° C. to about 400° C. is greater than or equal to about 40% of a total peak area of the thermogravimetric analysis graph.

3. The quantum dot of claim 1, wherein the quantum dot further comprise a semiconductor nanocrystal shell disposed on the semiconductor nanocrystal core, the nanocrystal shell comprising zinc and selenium.

4. The quantum dot of claim 3, wherein the semiconductor nanocrystal shell further comprises sulfur.

5. The quantum dot of claim 4, wherein the semiconductor nanocrystal shell comprises a first semiconductor nanocrystal shell disposed on the semiconductor nanocrystal core, the first semiconductor nanocrystal shell comprising zinc and selenium; and a second semiconductor nanocrystal shell disposed on the first semiconductor nanocrystal shell, the second semiconductor nanocrystal shell comprising zinc and sulfur.

6. The quantum dot of claim 1, wherein the quantum dot further comprises an organic compound disposed on a surface of the quantum dot, wherein the organic compound comprises a carboxyl group and/or a thiol group bound to the surface of the quantum dot.

7. The quantum dot of claim 6, wherein the portion of the organic compound bound to the surface of the quantum dot is the carboxyl group, and the organic compound is represented by RCOOH, RCOOR', or a combination thereof, wherein R and R' are each independently a substituted or unsubstituted C1 to C30 saturated or unsaturated aliphatic hydrocarbon group, a substituted or unsubstituted C3 to C30 saturated or unsaturated alicyclic hydrocarbon group, a substituted or unsubstituted C6 to C30 aromatic hydrocarbon group, or a combination thereof.

8. The quantum dot of claim 6, wherein the organic compound comprises a thiol group bound to the surface of the quantum dot at a terminal end; the organic compound including an organic group of a substituted or unsubstituted C1 to C30 saturated or unsaturated aliphatic hydrocarbon group, a substituted or unsubstituted C3 to C30 saturated or unsaturated alicyclic hydrocarbon group, a substituted or unsubstituted C6 to a C30 aromatic hydrocarbon group, or a combination thereof, at another terminal end; and —{($C_nH_{2n}$)$_a$—O}— wherein n and a are each independently an integer of greater than or equal to 1; and optionally —(C=O)O—, a substituted or unsubstituted C1 to C30 alkylene group, or a combination thereof, disposed between the thiol group and the organic group.

9. The quantum dot of claim 6, wherein the portion of the organic compound bound to the surface of the quantum dot is a thiol group, and the organic compound is represented by Chemical Formula 1:

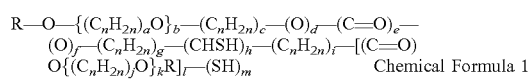

R—O—{($C_nH_{2n}$)$_a$O}$_b$—($C_nH_{2n}$)$_c$—(O)$_d$—(C=O)$_e$—(O)$_f$—($C_nH_{2n}$)$_g$—(CHSH)$_h$—($C_nH_{2n}$)$_i$—[(C=O)O{($C_nH_{2n}$)$_j$O}$_k$R]$_l$—(SH)$_m$  Chemical Formula 1 wherein, in Chemical Formula 1,
R is a substituted or unsubstituted C1 to C30 saturated or unsaturated aliphatic hydrocarbon group, a substituted or unsubstituted C3 to C30 saturated or unsaturated alicyclic hydrocarbon group, a substituted or unsubstituted C6 to C30 aromatic hydrocarbon group, or a combination thereof,
n is an integer of greater than or equal to 1,
a, b, c, g, i, j, and k are each independently an integer of greater than or equal to 0,
d, e, f, h, l, and m are all 0 or 1, provided that h and m are not both 0,
when h and m are both 1, l is 0, and
when h and l are both 1, m is 0.

10. The quantum dot of claim 6, wherein the organic compound in which the portion bound to the surface of the quantum dots is the thiol group is represented by one or more of Chemical Formula 1-1 to Chemical Formula 1-6:

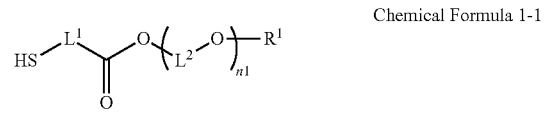

Chemical Formula 1-1

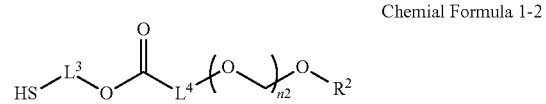

Chemial Formula 1-2

Chemical Formula 1-3

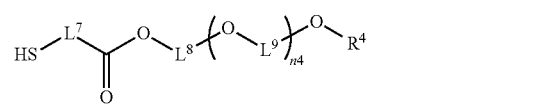

Chemical Formula 1-4

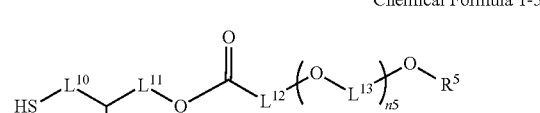

Chemical Formula 1-5

Chemical Formula 1-6

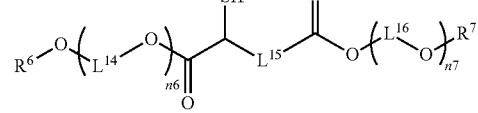

wherein, in Chemical Formula 1-1 to Chemical Formula 1-6,
$R^1$ to $R^7$ are each independently a substituted or unsubstituted C1 to C10 alkyl group or a substituted or unsubstituted C6 to C20 aryl group, $L^1$ to $L^{16}$ are each independently a substituted or unsubstituted C1 to C10 alkylene group, and n1 to n7 are each independently an integer of 0 to 10.

11. The quantum dot of claim 3, wherein a weight ratio of a weight of zinc to a weight of indium is from about 10:1 to about 30:1, and a weight ratio of a weight of selenium to a weight of indium is from about 2.9:1 to about 20:1.

12. A composition for preparing a quantum dot composite, comprising the quantum dot of claim 1, and at least one of a polymerizable monomer comprising a carbon-carbon unsaturated bond and a dispersant.

13. The composition of claim 12, further comprising a thiol compound having at least one thiol group at a terminal end, metal oxide particulates, or a combination thereof.

14. The composition of claim 12, wherein the dispersant is an organic compound comprising a carboxyl group, and the dispersant comprises a combination of monomers including a first monomer having a carboxyl group and a carbon-carbon double bond, a second monomer having a carbon-carbon double bond and a hydrophobic moiety and not having a carboxyl group, and optionally, a third monomer having a carbon-carbon double bond and a hydrophilic moiety and not having a carboxyl group, or a copolymer thereof;

a multi-aromatic ring-containing polymer having a backbone in which two aromatic rings in a main chain are bonded to quaternary carbon atoms that are constituent atoms of other cyclic moieties, and having a carboxyl group; or a combination thereof.

15. The composition of claim 13, wherein the metal oxide particulates comprise $TiO_2$, $SiO_2$, $BaTiO_3$, $Ba_2TiO_4$, ZnO, or a combination thereof.

16. The composition of claim 13, wherein the thiol compound comprises a compound represented by Chemical Formula 2:

Chemical Formula 2

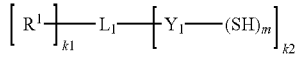

wherein, in Chemical Formula 2, $R^1$ is hydrogen; a substituted or unsubstituted C1 to C30 linear or branched alkyl group; a substituted or unsubstituted C6 to C30 aryl group; a substituted or unsubstituted C3 to C30 heteroaryl group; a substituted or unsubstituted C3 to C30 cycloalkyl group; a substituted or unsubstituted C3 to C30 heterocycloalkyl group; a C1 to C10 alkoxy group; a hydroxy group; —$NH_2$; a substituted or unsubstituted C1 to C30 amine group (—NRR', wherein R and R' are each independently hydrogen or a C1 to C30 linear or branched alkyl group and not hydrogen at the same time); an isocyanate group; a halogen; —ROR' wherein R is a substituted or unsubstituted C1 to C20 alkylene group and R' is hydrogen or a C1 to C20 linear or branched alkyl group; an acyl halide group (—RC(=O)X, wherein R is a substituted or unsubstituted C1 to C20 alkylene group and X is a halogen); —C(=O)OR' (wherein R' is hydrogen or a C1 to C20 linear or branched alkyl group); —ON; or —C(=O)ORR' or —C(=O)ONRR', wherein R and R' are each independently hydrogen or a C1 to C20 linear or branched alkyl group, $L_1$ is a carbon atom, a substituted or unsubstituted C1 to C30 alkylene group, a substituted or unsubstituted C1 to C30 alkylene group in which at least one methylene (—$CH_2$—) is replaced by sulfonyl (—$SO_2$—), carbonyl (CO), ether bond (—O—), sulfide group (—S—), sulfoxide group (—SO—), ester group (—C(=O)O—), amide group (—C(=O)NR—, wherein R is hydrogen or a C1 to C10 linear or branched alkyl group), or a combination thereof, a substituted or unsubstituted C3 to C30 cycloalkylene group, a substituted or unsubstituted C6 to C30 arylene group, a substituted or unsubstituted C3 to C30 heteroarylene group, or a substituted or unsubstituted C3 to C30 heterocycloalkylene group, $Y_1$ is a single bond; a substituted or unsubstituted C1 to C30 alkylene group; a substituted or unsubstituted C2 to C30 alkenylene group; or a C1 to C30 alkylene group or a C2 to C30 alkenylene group in which at least one methylene (—$CH_2$—) is replaced by sulfonyl (—S(=O)$_2$—), carbonyl (—C(=O)—), ether bond (—O—), sulfide group (—S—), sulfoxide group (—S(=O)—), ester group (—C(=O)O—), amide group (—C(=O)NR—, wherein R is hydrogen or a C1 to C10 linear or branched alkyl group), imine group (—NR—, wherein R is hydrogen or a C1 to C10 linear or branched alkyl group), or a combination thereof, m is an integer of greater than or equal to 1, k1 is 0 or an integer of greater than or equal to 1 and k2 is an integer of greater than or equal to 1, a sum of m and k2 is an integer of greater than or equal to 3, m does not exceed the valence of $Y_1$, and a sum of k1 and k2 does not exceed the valence of $L_1$.

\* \* \* \* \*